(12) United States Patent
Liu

(10) Patent No.: US 11,742,338 B2
(45) Date of Patent: Aug. 29, 2023

(54) DISPLAY APPARATUS AND MANUFACTURING METHOD THEREOF

(71) Applicant: Au Optronics Corporation, Hsinchu (TW)

(72) Inventor: Chung-Chan Liu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 50 days.

(21) Appl. No.: 17/463,540

(22) Filed: Aug. 31, 2021

(65) Prior Publication Data

US 2021/0398963 A1 Dec. 23, 2021

Related U.S. Application Data

(62) Division of application No. 16/654,009, filed on Oct. 16, 2019, now Pat. No. 11,177,247.

(30) Foreign Application Priority Data

Jun. 4, 2019 (TW) .................................. 108119337

(51) Int. Cl.
*H01L 25/16* (2023.01)
*H01L 27/32* (2006.01)
*H10K 59/131* (2023.01)

(52) U.S. Cl.
CPC ......... *H01L 25/167* (2013.01); *H10K 59/131* (2023.02)

(58) Field of Classification Search
CPC . H01L 25/167; H01L 25/0753; H01L 27/156; H01L 27/3276
See application file for complete search history.

(56) References Cited

U.S. PATENT DOCUMENTS 8,860,045 B2 * 10/2014 Lin ..................... H01L 25/0753
257/E33.057
2019/0088196 A1 * 3/2019 Chu ..................... G09G 3/2003

* cited by examiner

*Primary Examiner* — John A Bodnar
(74) *Attorney, Agent, or Firm* — JCIPRNET

(57) ABSTRACT

A display apparatus includes a driving substrate and a first light emitting diode element. The driving substrate has a plurality of driving structures. Each of the driving structures includes a first pad, a second pad, a third pad and a fourth pad. The plurality of driving structures include a first driving structure. The first light emitting diode element is electrically connected to a first pad and a second pad of the first driving structure, and the first light emitting diode element crosses a line connecting a third pad and a fourth pad of the first driving structure. A manufacturing method of the display apparatus is also provided.

9 Claims, 36 Drawing Sheets

DISPLAY APPARATUS AND MANUFACTURING METHOD THEREOF

CROSS-REFERENCE TO RELATED APPLICATION

This application is a divisional application of and claims the priority benefit of U.S. application Ser. No. 16/654,009, filed on Oct. 16, 2019, now allowed, which claims the priority benefit of Taiwan application serial no. 108119337, filed on Jun. 4, 2019. The entirety of each of the above-mentioned patent applications is hereby incorporated by reference herein and made a part of this specification.

BACKGROUND

Technical Field

The present invention relates to a light emitting apparatus and a manufacturing method thereof, and particularly relates to a display apparatus and a manufacturing method thereof.

Description of Related Art

A light emitting diode display apparatus includes a driving substrate and a plurality of micro light emitting diodes (micro-LEDs) transferred on the driving substrate. Inheriting the characteristics of the light emitting diode, the light emitting diode display apparatus has the advantages of power saving, high efficiency, high brightness, short response time, and the like. Furthermore, compared with an organic light emitting diode display apparatus, the light emitting diode display apparatus also has the advantages of easy color adjustment, long light emitting life, no image imprinting, and the like. Therefore, the light emitting diode display apparatus is considered to be the display technology of the next generation.

However, the preliminarily completed light emitting diode display apparatus has many defects. How to quickly repair the light emitting diode display apparatus without relying on redundancy on the premise of saving crystal grains is a major issue in the development of the light emitting diode display apparatus at the present stage.

SUMMARY

The present invention is directed to a display apparatus easy to repair.

The present invention is directed to a manufacturing method of the display apparatus, and the manufacturing method can be used for manufacturing the display apparatus easy to repair.

The display apparatus provided by the present invention includes a driving substrate and a first light emitting diode element. The driving substrate has a plurality of driving structures. Each of the driving structures includes a first pad, a second pad, a third pad and a fourth pad. The plurality of driving structures include a first driving structure. The first light emitting diode element is electrically connected to the first pad and the second pad of the first driving structure, and the first light emitting diode element crosses a line connecting the third pad and the fourth pad of the first driving structure.

In an embodiment of the present invention, the first pad and the third pad have a same first potential, and the second pad and the fourth pad have a same second potential.

In an embodiment of the present invention, the first pad, the second pad, the third pad and the fourth pad are structurally separated.

In an embodiment of the present invention, the first pad is connected with the third pad.

In an embodiment of the present invention, the second pad is connected with the fourth pad.

In an embodiment of the present invention, the display apparatus further includes a second light emitting diode element. The plurality of driving structures further include a second driving structure. The second light emitting diode element is electrically connected to the third pad and the fourth pad of the second driving structure. The first pad of the first driving structure and the second pad of the first driving structure are arranged in a first direction, the third pad of the second driving structure and the fourth pad of the second driving structure are arranged in a second direction, and the first direction intersects with the second direction.

In an embodiment of the present invention, the first light emitting diode element includes a first type semiconductor layer, a second type semiconductor layer, an active layer arranged between the first type semiconductor layer and the second type semiconductor layer, a first electrode electrically connected to the first type semiconductor layer, and a second electrode electrically connected to the second type semiconductor layer, wherein the first electrode is arranged between the first type semiconductor layer and the first pad, and the second electrode is arranged between the second type semiconductor layer and the second pad.

In an embodiment of the present invention, the first light emitting diode element includes a first type semiconductor layer, a second type semiconductor layer, an active layer arranged between the first type semiconductor layer and the second type semiconductor layer, a first electrode electrically connected to the first type semiconductor layer, and a second electrode electrically connected to the second type semiconductor layer, wherein the first type semiconductor layer is arranged between the first electrode and the first pad, and the second type semiconductor layer is arranged between the second electrode and the second pad.

In an embodiment of the present invention, the first light emitting diode element includes a first type semiconductor layer, a second type semiconductor layer, an active layer arranged between the first type semiconductor layer and the second type semiconductor layer, a first electrode electrically connected to the first type semiconductor layer, and a second electrode electrically connected to the second type semiconductor layer, wherein the first type semiconductor layer is arranged between the first electrode and the first pad, and the second electrode is arranged between the second type semiconductor layer and the second pad.

A manufacturing method of the display apparatus includes the following steps: providing a driving substrate with a plurality of driving structures, wherein each of the driving structures includes a first pad, a second pad, a third pad and a fourth pad, the first pad and the second pad are arranged in a first direction, the third pad and the fourth pad are arranged in a second direction, and the first direction intersects with the second direction; and transferring a plurality of first light emitting diode elements to the driving substrate, wherein the plurality of first light emitting diode elements are electrically connected to a plurality of first pads and a plurality of second pads of a plurality of first driving structures of the plurality of driving structures.

In an embodiment of the present invention, the plurality of driving structures further include a second driving structure, and the manufacturing method of the display apparatus further includes: after the plurality of first light emitting diode elements are transferred to the driving substrate, enabling a plurality of second light emitting diode elements to move towards the driving substrate so as to enable a second light emitting diode element in the plurality of second light emitting diode elements to be transferred on the second driving structure, wherein another second light emitting diode element in the plurality of second light emitting diode elements is blocked by a first light emitting diode element in the plurality of first light emitting diode elements.

In an embodiment of the present invention, the manufacturing method of the display apparatus further includes: enabling the second light emitting diode element to be electrically connected to the third pad and the fourth pad of the second driving structure.

In order to make the aforementioned and other objectives and advantages of the present invention comprehensible, embodiments accompanied with figures are described in detail below.

DESCRIPTION OF THE EMBODIMENTS

Figure 1A:
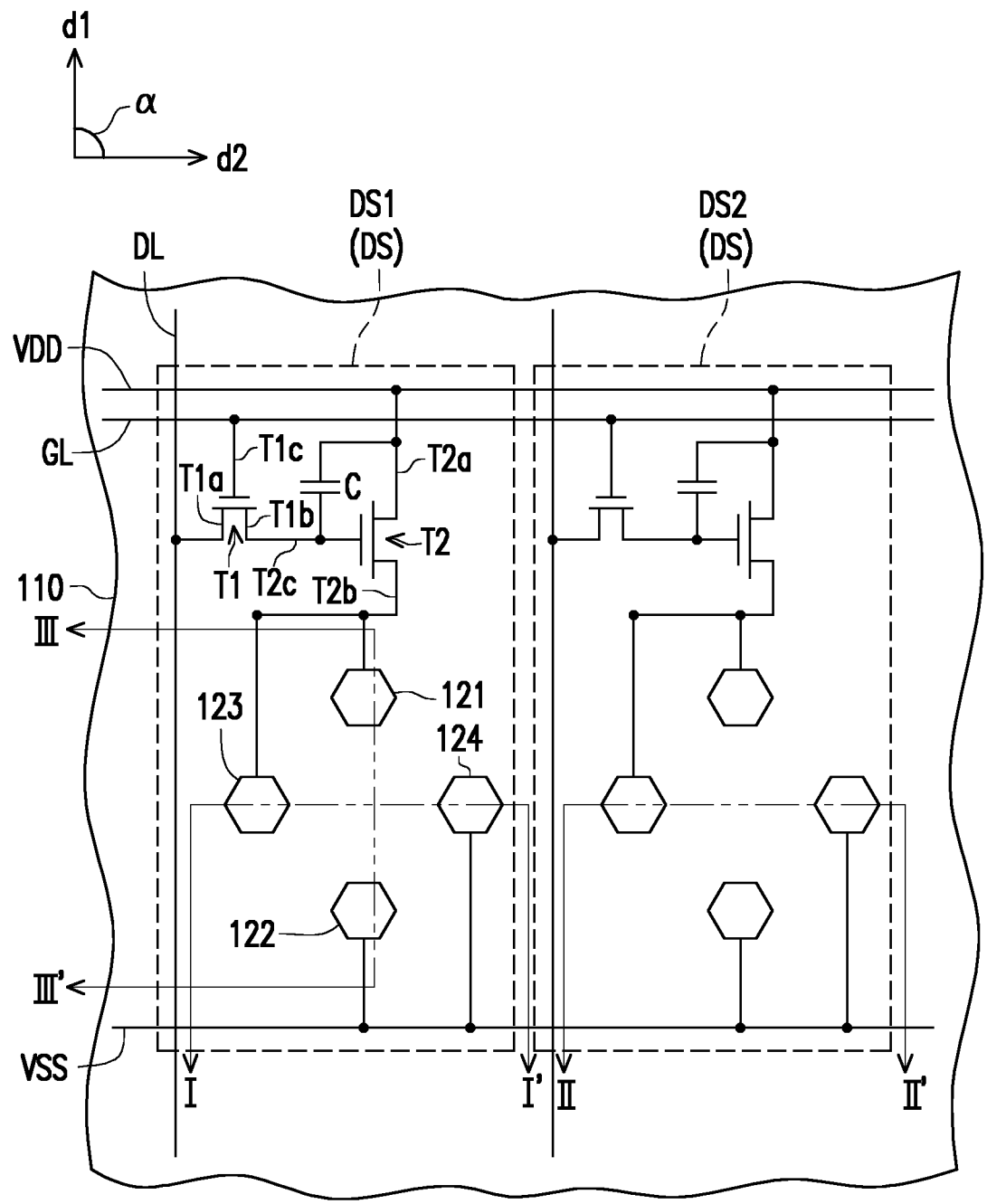
FIG. 1A to FIG. 1D are schematic top views of manufacturing processes of a display apparatus according to a first embodiment of the present invention.

Reference will now be made in detail to the present preferred embodiments of the invention, examples of which are illustrated in the accompanying drawings. Wherever possible, the same reference numbers are used in the drawings and the description to refer to the same or like parts.

It should be understood that when a component such as a layer, film, region or substrate is referred to as being "on" or "connected" to another component, it may be directly on or connected to the another component, or intervening components may also be present. In contrast, when a component is referred to as being "directly on" or "directly connected to" another component, there are no intervening assemblies present. As used herein, "connection" may refer to a physical and/or electrical connection. Besides, when the term "electrically connected to" or "coupled" is used, there may exist other intervening elements between two elements.

As used herein, "about", "approximately", or "substantially" is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, ±20%, ±10%, ±5% of the stated value. Further, as used herein, "about", "approximately", or "substantially" may depend on optical properties, etch properties, or other properties to select a more acceptable range of deviations or standard deviations without one standard deviation for all properties.

Unless otherwise defined, all terms (including technical and scientific terms) used herein have the same meaning as commonly understood by one of ordinary skill in the art to which the present invention belongs. It will be further understood that terms such as those defined in commonly used dictionaries should be interpreted as having a meaning that is consistent with their meaning in the context of the relevant art and the present invention and will not be interpreted in an idealized or overly formal sense unless expressly so defined herein.

FIG. 1A to FIG. 1D are schematic top views of manufacturing processes of a display apparatus according to a first embodiment of the present invention.

FIG. 2A to FIG. 2D are schematic cross-sectional views of the manufacturing processes of the display apparatus according to the first embodiment of the present invention. FIG. 2A to FIG. 2D are respectively corresponding to a section line I-I', a section line II-II' and a section line III-III' in FIG. 1A to FIG. 1D.

The manufacturing processes and structures of display apparatuses 10 and 10' (shown in FIG. 1B and FIG. 1D) according to the first embodiment of the present invention are described with reference to FIG. 1A to FIG. 1D and FIG. 2A to FIG. 2D.

Figure 2A:
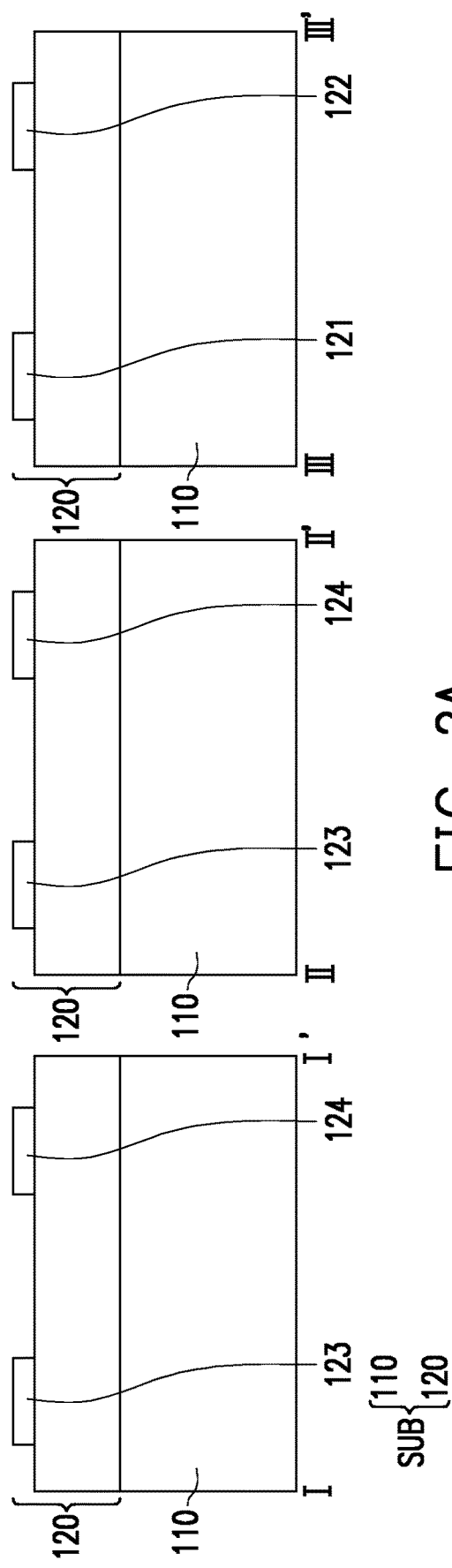
FIG. 2A to FIG. 2D are schematic cross-sectional views of the manufacturing processes of the display apparatus according to the first embodiment of the present invention.

Referring to FIG. 1A and FIG. 2A, firstly, a driving substrate SUB is provided. The driving substrate SUB can also be referred to as a backplane. In the present embodiment, the driving substrate SUB can include a substrate 110 and a driving circuit layer 120 arranged on the substrate 110. The driving circuit layer 120 has a plurality of driving structures DS.

For example, in the present embodiment, a driving structure DS can include a first transistor T1, a second transistor T2, a capacitor C, a data line DL, a scan line GL, a power line VDD, a shared line VSS, a first pad 121, a second pad 122, a third pad 123 and a fourth pad 124.

The first transistor T1 has a first end T1$a$, a second end T1$b$ and a control end T1$c$. The second transistor T2 has a first end T2$a$, a second end T2$b$ and a control end T2$c$. The first end T1$a$ of the first transistor T1 is electrically connected to the data line DL. The control end T1$c$ of the first transistor T1 is electrically connected to the scan line GL. The second end T1$b$ of the first transistor T1 is electrically connected to the control end T2$c$ of the second transistor T2. The first end T2$a$ of the second transistor T2 is electrically connected to the power line VDD. The capacitor C is electrically connected to the first end T2$a$ of the second transistor T2 and the control end T2$c$ of the second transistor T2.

The first pad 121 and the third pad 123 have a same first potential. The second pad 122 and the fourth pad 124 have a same second potential. The first potential and the second potential can have a potential difference for driving a light emitting diode element 130 (shown in FIG. 1D), so that the light emitting diode element 130 has a corresponding brightness to display a picture.

For example, in the present embodiment, both the first pad 121 and the third pad 123 can be electrically connected to the second end T2b of the second transistor T2, and both the second pad 122 and the fourth pad 124 can be electrically connected to the shared line VSS, but the present invention is not limited thereto.

The first pad 121 having the first potential is structurally separated from the second pad 122 having the second potential and the fourth pad 124 having the second potential, and the third pad 123 having the first potential is structurally separated from the second pad 122 having the second potential and the fourth pad 124 having the second potential.

For example, in the present embodiment, the first pad 121, the second pad 122, the third pad 123 and the fourth pad 124 are structurally separated from each other selectively, but the present invention is not limited thereto.

Figure 1B:
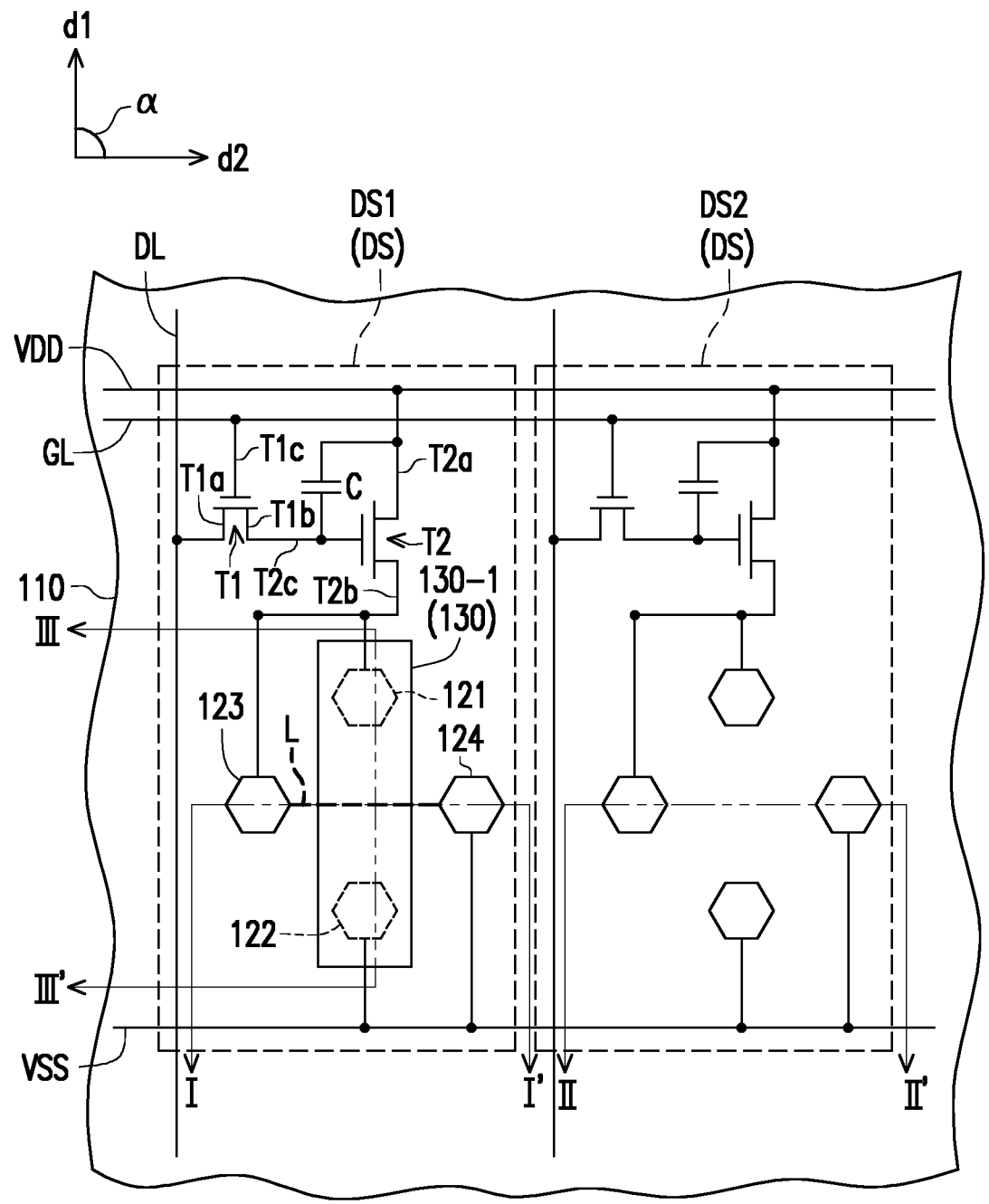
Figure 1C:
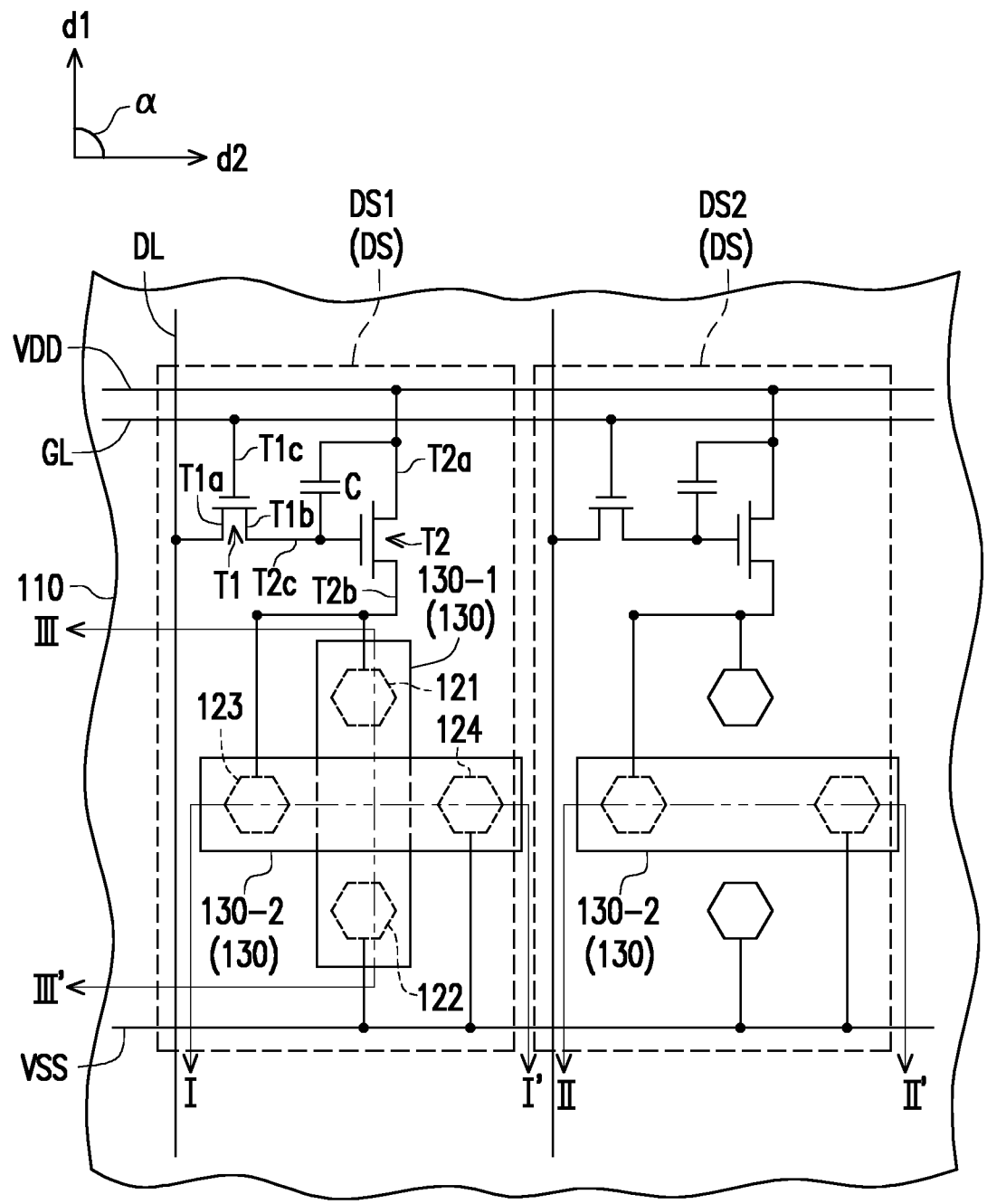
Figure 1D:
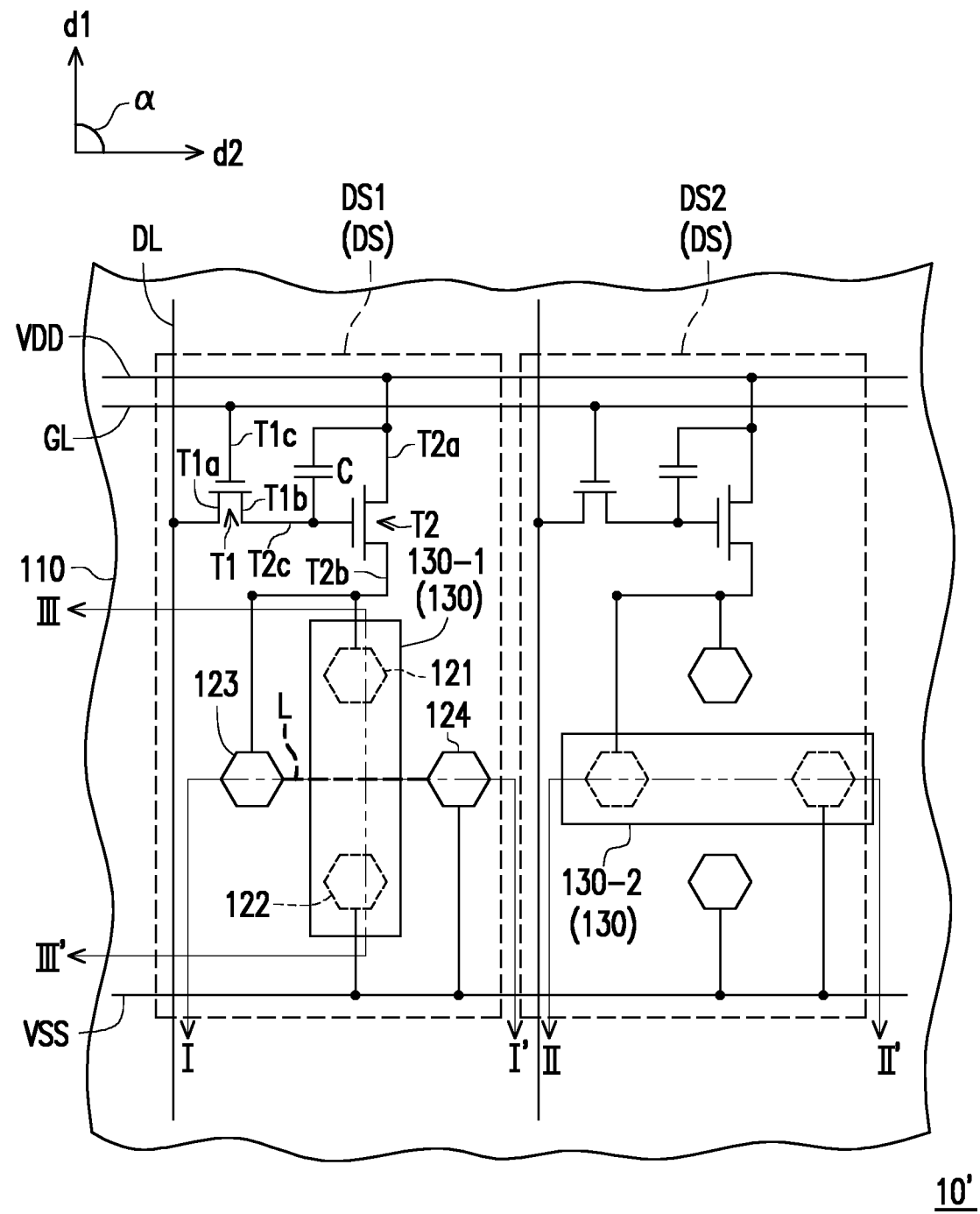

A first pad 121 and a second pad 122 of a driving structure DS can be regarded as a first pad set electrically connected to a light emitting diode element 130 (shown in FIG. 1D). A third pad 123 and a fourth pad 124 of a driving structure DS can be regarded as a second pad set electrically connected to another light emitting diode element 130.

The first pad 121 and the second pad 122 of the first pad set are arranged in a first direction d1, the third pad 123 and the fourth pad 124 of the second pad set are arranged in a second direction d2, and the first direction d1 intersects with the second direction d2. In other words, an included angle α is formed between the first direction d1 and the second direction d2, and 0°<α<180°. For example, in the present embodiment, the included angle α between the first direction d1 and the second direction d2 can be 90°, but the present invention is not limited thereto.

Figure 2B:
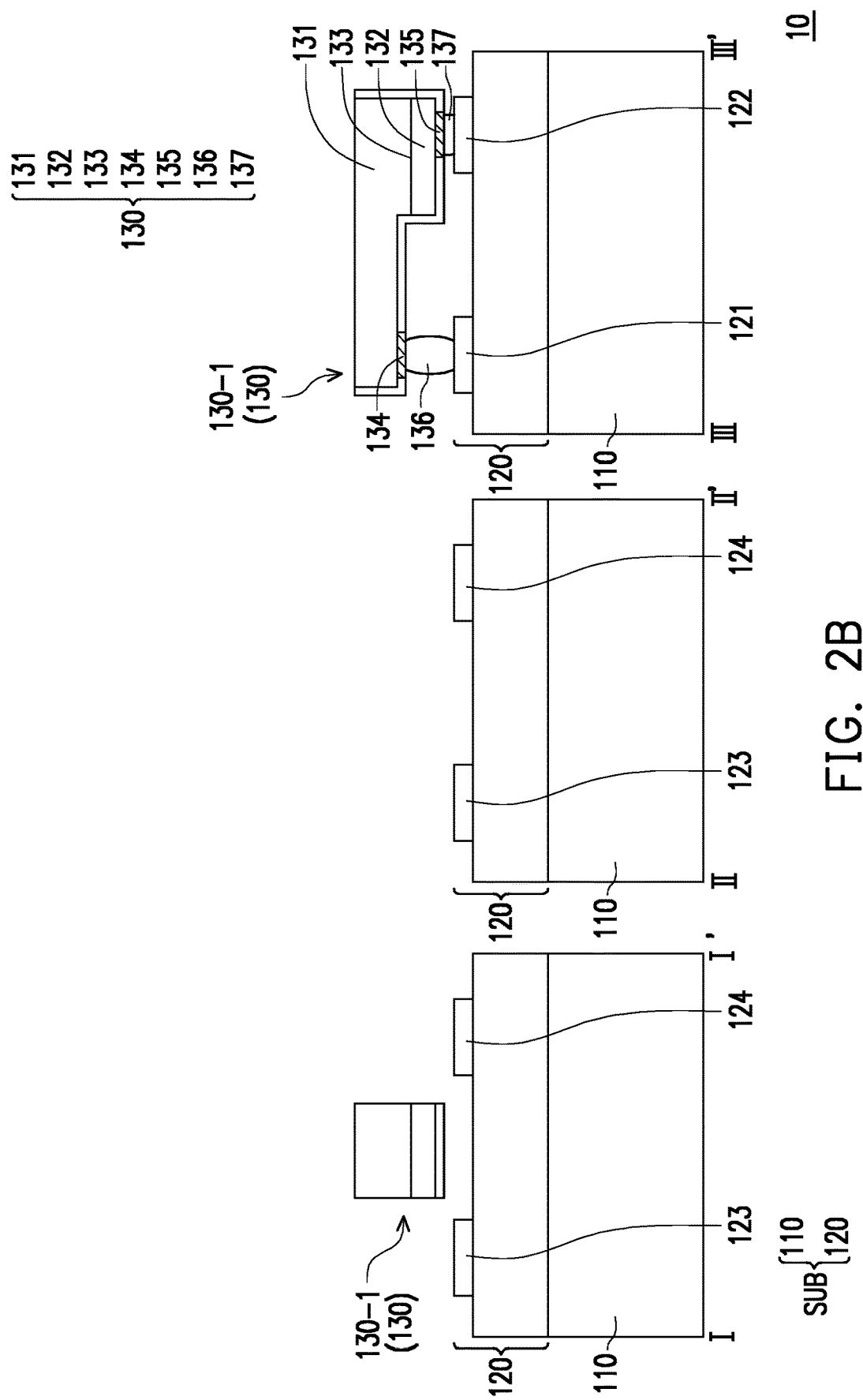

Referring to FIG. 1B and FIG. 2B, subsequently, an extraction element (not shown) is used for transferring a plurality of light emitting diode elements 130 to the driving substrate SUB, and the plurality of light emitting diode elements 130 are electrically connected to a plurality of first pads 121 and a plurality of second pads 122 of a plurality of driving structures DS.

FIG. 1B and FIG. 2B show an example in which a light emitting diode element 130 is transferred to a first pad 121 and a second pad 122 of a driving structure DS. According to FIG. 1B and FIG. 2B, those skilled in the art can understand how the plurality of light emitting diode elements 130 are transferred to the plurality of first pads 121 and the plurality of second pads 122 of the plurality of driving structures DS, and thus will not be repeatedly illustrated.

Referring to FIG. 2B, the light emitting diode element 130 includes a first type semiconductor layer 131, a second type semiconductor layer 132, an active layer 133, a first electrode 134 and a second electrode 135. The active layer 133 is arranged between the first type semiconductor layer 131 and the second type semiconductor layer 132. The first electrode 134 is electrically connected to the first type semiconductor layer 131. The second electrode 135 is electrically connected to the second type semiconductor layer 132.

In the present embodiment, when the light emitting diode element 130 is transferred to the driving substrate SUB, the light emitting diode element 130 can be electrically connected to the driving structure DS simultaneously. Specifically, in the present embodiment, when the light emitting diode element 130-1 is transferred, the first electrode 134 and the second electrode 135 of the light emitting diode element 130-1 can selectively face the driving substrate SUB, and conductive substances 136 and 137 (including but not limited to solder balls, silver adhesives, and anisotropic conductive adhesives) can be respectively arranged on the first electrode 134 and the second electrode 135 of the light emitting diode element 130-1. When the light emitting diode element 130-1 on the extraction element is close to the driving substrate SUB, the conductive substances 136 and 137 on the first electrode 134 and the second electrode 135 of the light emitting diode element 130-1 can be respectively connected with the first pad 121 and the second pad 122 of the driving substrate SUB, so that the first electrode 134 and the second electrode 135 of the light emitting diode element 130-1 are electrically connected to the first pad 121 and the second pad 122 of the driving substrate SUB respectively.

After the light emitting diode element 130-1 is formed on the driving substrate SUB by the above flip chip mode, the first electrode 134 of the light emitting diode element 130-1 is arranged between the first type semiconductor layer 131 of the light emitting diode element 130-1 and the first pad 121, and the second electrode 135 of the light emitting diode element 130-1 is arranged between the second type semiconductor layer 132 of the light emitting diode element 130-1 and the second pad 122.

Referring to FIG. 1B, it should be noted that after a plurality of light emitting diode elements 130-1 are electrically connected to the plurality of first pads 121 and the plurality of second pads 122 of the plurality of driving structures DS, a light emitting diode element 130-1 electrically connected to a first pad 121 and a second pad 122 of a driving structure DS crosses a line L connecting a third pad 123 and a fourth pad 124. Therefore, a display apparatus 10 is preliminarily completed.

Subsequently, the display apparatus 10 is checked. After checking, if at least one driving structure DS2 is not provided with the light emitting diode element 130, the repair operations in subsequent FIG. 1C, FIG. 1D, FIG. 2C and FIG. 2D can be performed; or if at least one light emitting diode element 130 of at least one driving structure DS2 is abnormal, after the abnormal light emitting diode element 130 is removed, the repair operations in subsequent FIG. 1C, FIG. 1D, FIG. 2C and FIG. 2D can be performed. The details are described with reference to FIG. 1C, FIG. 1D, FIG. 2C and FIG. 2D below.

Referring to FIG. 1C, FIG. 1D, FIG. 2C and FIG. 2D, after the plurality of light emitting diode elements 130-1 are transferred to the driving substrate SUB, the extraction element 160 (shown in FIG. 2C) extracts the plurality of light emitting diode elements 130-2 and performs rotation for an angle. Then, the extraction element 160 (shown in FIG. 2C) is moved towards the driving substrate SUB so as to enable the light emitting diode elements 130-2 to be transferred to the driving structure DS2, wherein the light emitting diode element 130-2 is electrically connected to the third pad 123 and the fourth pad 124 of the driving structure DS2.

In the present embodiment, when the light emitting diode element 130-2 is transferred to the driving substrate SUB, the light emitting diode element 130-2 can be electrically connected to the driving structure DS simultaneously. Specifically, in the present embodiment, when the light emitting diode element 130-2 is transferred, the first electrode 134 and the second electrode 135 of the light emitting diode element 130-2 can selectively face the driving substrate SUB, and conductive substances 136 and 137 (including but not limited to solder balls, silver adhesives, and anisotropic conductive adhesives) can be respectively arranged on the first electrode 134 and the second electrode 135 of the light emitting diode element 130-2. When the light emitting diode element 130-2 on the extraction element 160 (shown in FIG. 2C) is close to the driving substrate SUB, the conductive substances 136 and 137 on the first electrode 134 and the second electrode 135 of the light emitting diode element 130-2 can be respectively connected with the third pad 123 and the fourth pad 124 of the driving substrate SUB, so that the first electrode 134 and the second electrode 135 of the light emitting diode element 130-2 are electrically connected to the third pad 123 and the fourth pad 124 of the driving substrate SUB respectively.

After the light emitting diode element 130-2 is formed on the driving substrate SUB by the above flip chip mode, the first electrode 134 of the light emitting diode element 130-2 is arranged between the first type semiconductor layer 131 of the light emitting diode element 130-2 and the third pad 123, and the second electrode 135 of the light emitting diode element 130-2 is arranged between the second type semiconductor layer 132 of the light emitting diode element 130-2 and the fourth pad 124. Therefore, a repaired display apparatus 10' is completed.

Figure 2C:
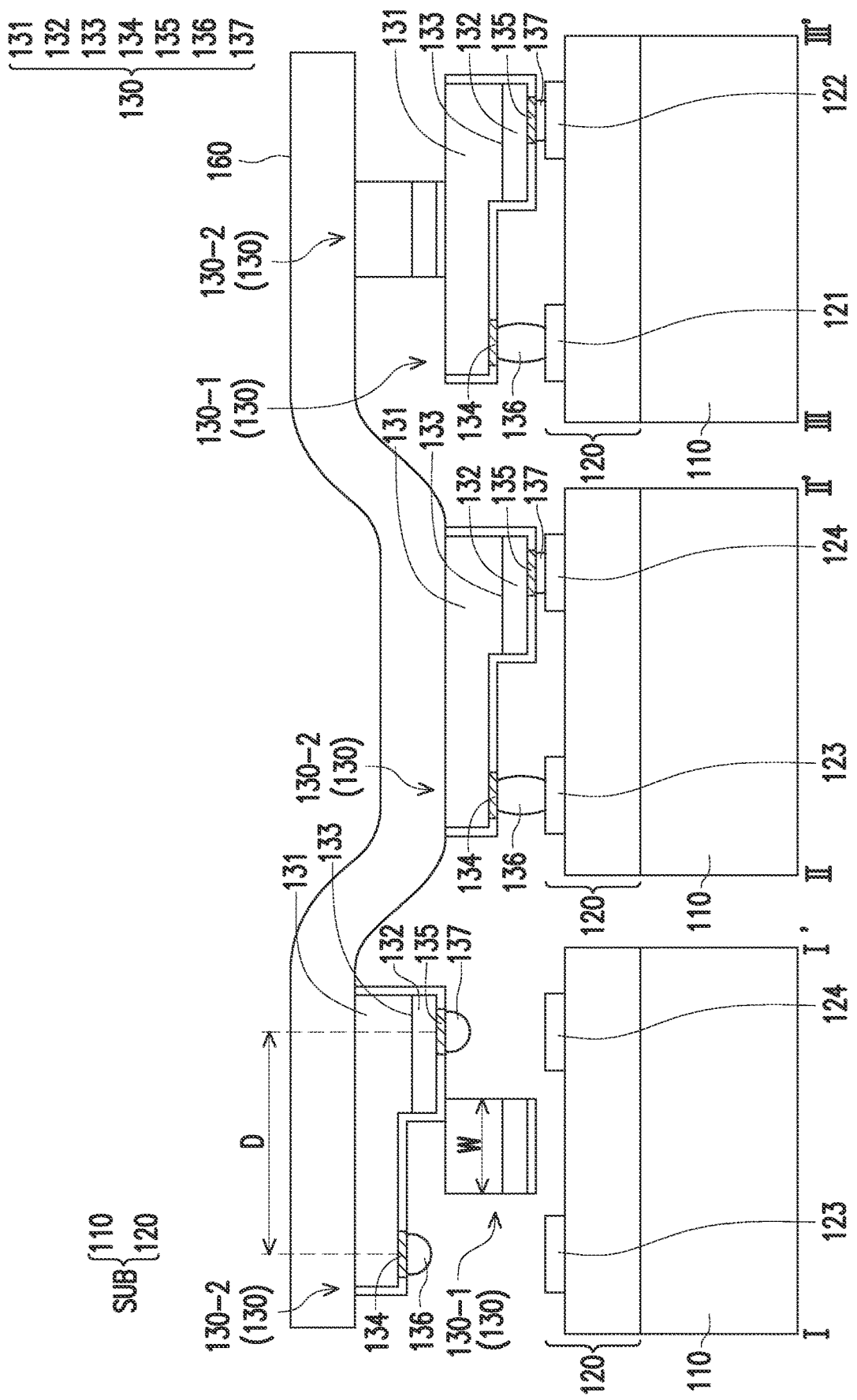
Figure 2D:
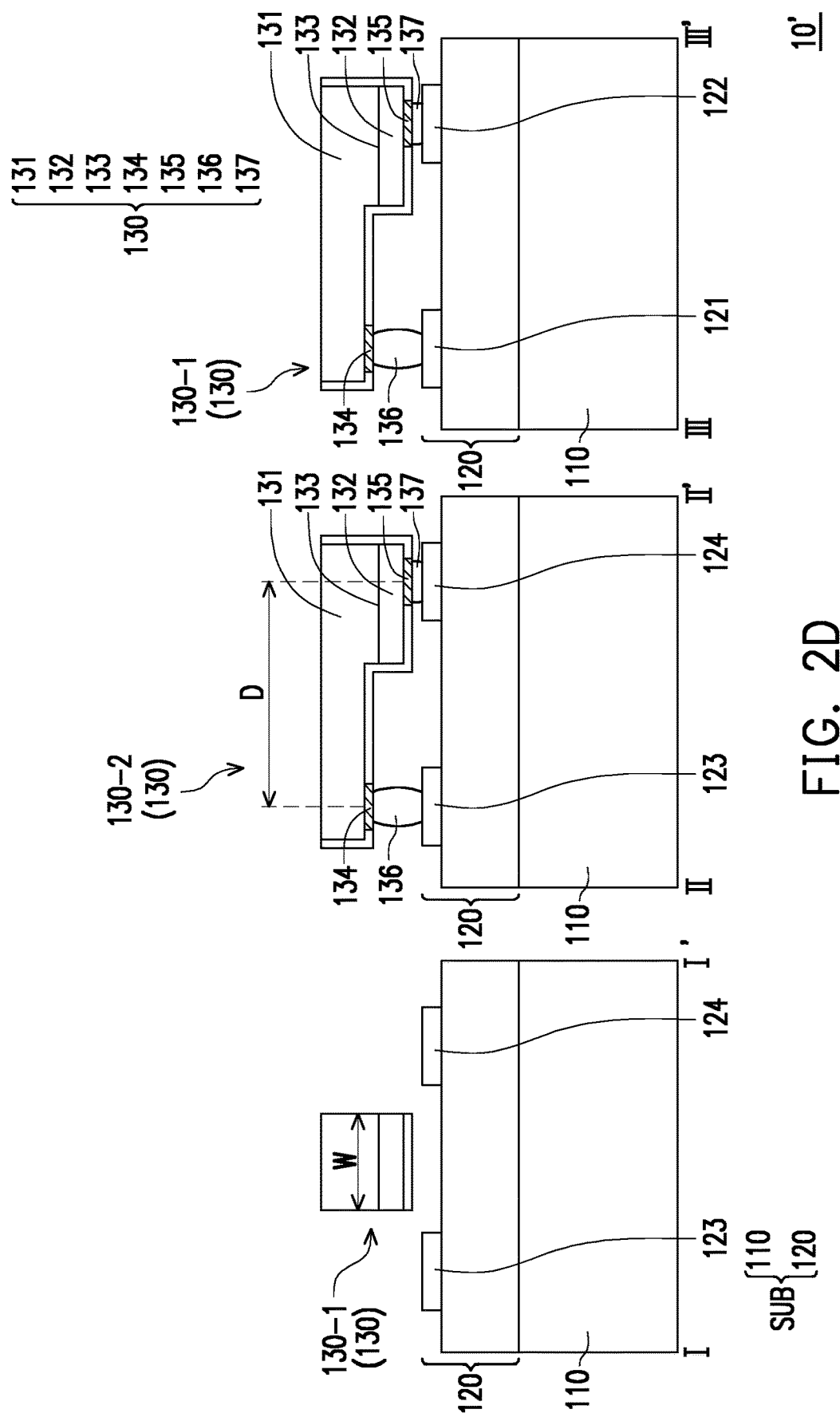

Referring to FIG. 1C and FIG. 2C, it should be noted that in the process of transferring a light emitting diode element 130-2 to a driving structure DS2, another light emitting diode element 130-2 (such as the light emitting diode element 130-2 at the left side in FIG. 1C) on the extraction element 160 (shown in FIG. 2C) is blocked by a light emitting diode element 130-1 arranged on the driving substrate SUB. Referring to FIG. 1C, FIG. 1D, FIG. 2C and FIG. 2D, when the light emitting diode element 130-2 (such as the light emitting diode element 130-2 at the right side in FIG. 1C) which is not blocked by the light emitting diode element 130-1 is transferred to the driving structure DS2 and the extraction element 160 (shown in FIG. 2C) is separated from the driving substrate SUB, the light emitting diode element 130-2 previously blocked by the light emitting diode element 130-1 is taken away by the extraction element 160 (shown in FIG. 2C) and can be reused (for example, in the next repair operation, the light emitting diode element 130-2 is arranged on another driving structure DS2).

Therefore, it is not necessary to provide a plurality of light emitting diode elements 130 on a driving structure DS at the beginning of manufacturing the display apparatus 10, the number of the light emitting diode elements 130 to be used can be reduced, and the manufacturing cost of the display apparatus 10 can be lowered. Furthermore, the display apparatus 10 can be quickly repaired by the above repair method. Furthermore, in the repair process, the light emitting diode element 130-2 blocked by the light emitting diode element 130-1 formed on the driving substrate SUB can be recycled and reused, so that the repair cost can be lowered.

Although the repair method needs to be used in conjunction with the driving structure DS provided with the first pad 121, the second pad 122, the third pad 123 and the fourth pad 124, because the first pad 121 and the second pad 122 are arranged in a first direction d1, the third pad 123 and the fourth pad 124 are arranged in a second direction d2 and the first direction d1 intersects with the second direction d2 (that is, the first pad 121, the second pad 122, the third pad 123 and the fourth pad 124 are closely arranged), the arrangement of the first pad 121, the second pad 122, the third pad 123 and the fourth pad 124 does not excessively affect the resolution of the display apparatuses 10 and 10'. Furthermore, because the first pad 121, the second pad 122, the third pad 123 and the fourth pad 124 are closely arranged, compared with a general structure with a standby driving method, an embodiment of the present invention can slightly save the space.

The following embodiments follow the element symbols and partial contents of the above embodiments, same symbols are used for representing same or similar elements, and the descriptions of the same technical contents are omitted. The descriptions of the omitted portions can refer to the above embodiments, and the descriptions are omitted in the following embodiments.

FIG. 3A to FIG. 3E are schematic top views of manufacturing processes of a display apparatus according to a second embodiment of the present invention.

FIG. 4A to FIG. 4E are schematic cross-sectional views of the manufacturing processes of the display apparatus according to the second embodiment of the present invention. FIG. 4A to FIG. 4E are respectively corresponding to a section line I-I', a section line II-II' and a section line III-III' in FIG. 3A to FIG. 3E. FIG. 3A to FIG. 3E omit a fixed layer 140 in FIG. 4A to FIG. 4E.

The display apparatuses 10A and 10A' according to the second embodiment and the manufacturing method thereof are similar to the display apparatuses 10 and 10' according to the first embodiment and the manufacturing method thereof, and the difference therebetween is as follows: in the second embodiment, the light emitting diode element 130 is lateral, and the manner in which the lateral light emitting diode element 130 is electrically connected to the driving substrate SUB is slightly different from the above embodiment. The details are described with reference to FIG. 3A to FIG. 3E and FIG. 4A to FIG. 4E below.

Figure 3A:
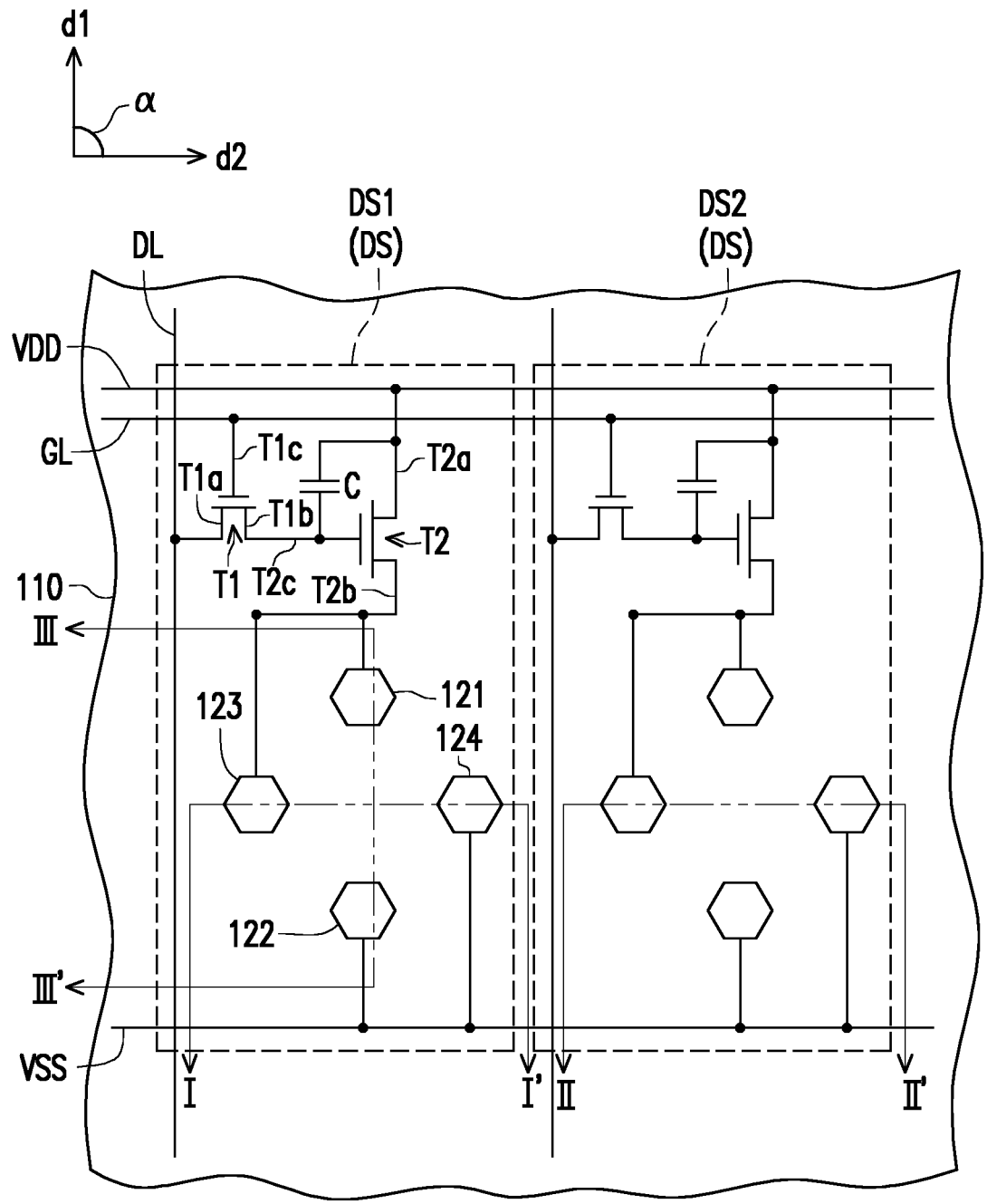
FIG. 3A to FIG. 3E are schematic top views of manufacturing processes of a display apparatus according to a second embodiment of the present invention.
Figure 4A:
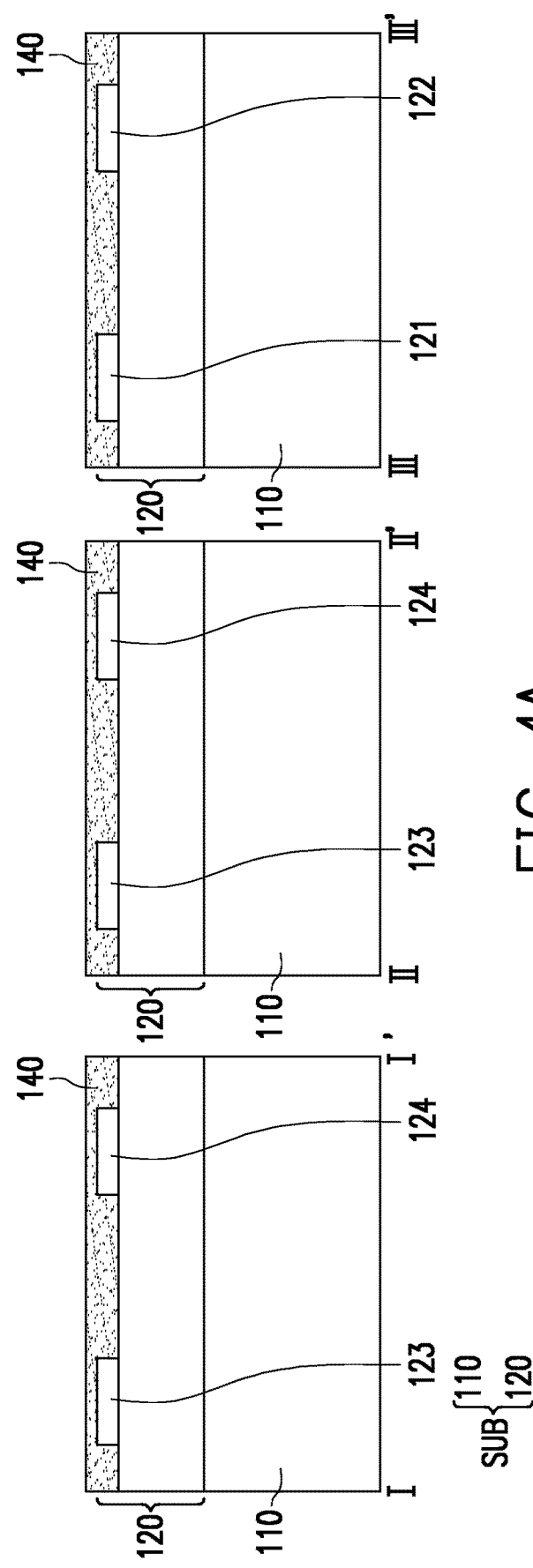
FIG. 4A to FIG. 4E are schematic cross-sectional views of the manufacturing processes of the display apparatus according to the second embodiment of the present invention.

Referring to FIG. 3A and FIG. 4A, firstly, a driving substrate SUB is provided. The driving substrate SUB has a plurality of driving structures DS. Different from the first embodiment, each of the driving structures DS of the driving substrate SUB is also provided with a fixed layer 140.

Figure 3B:
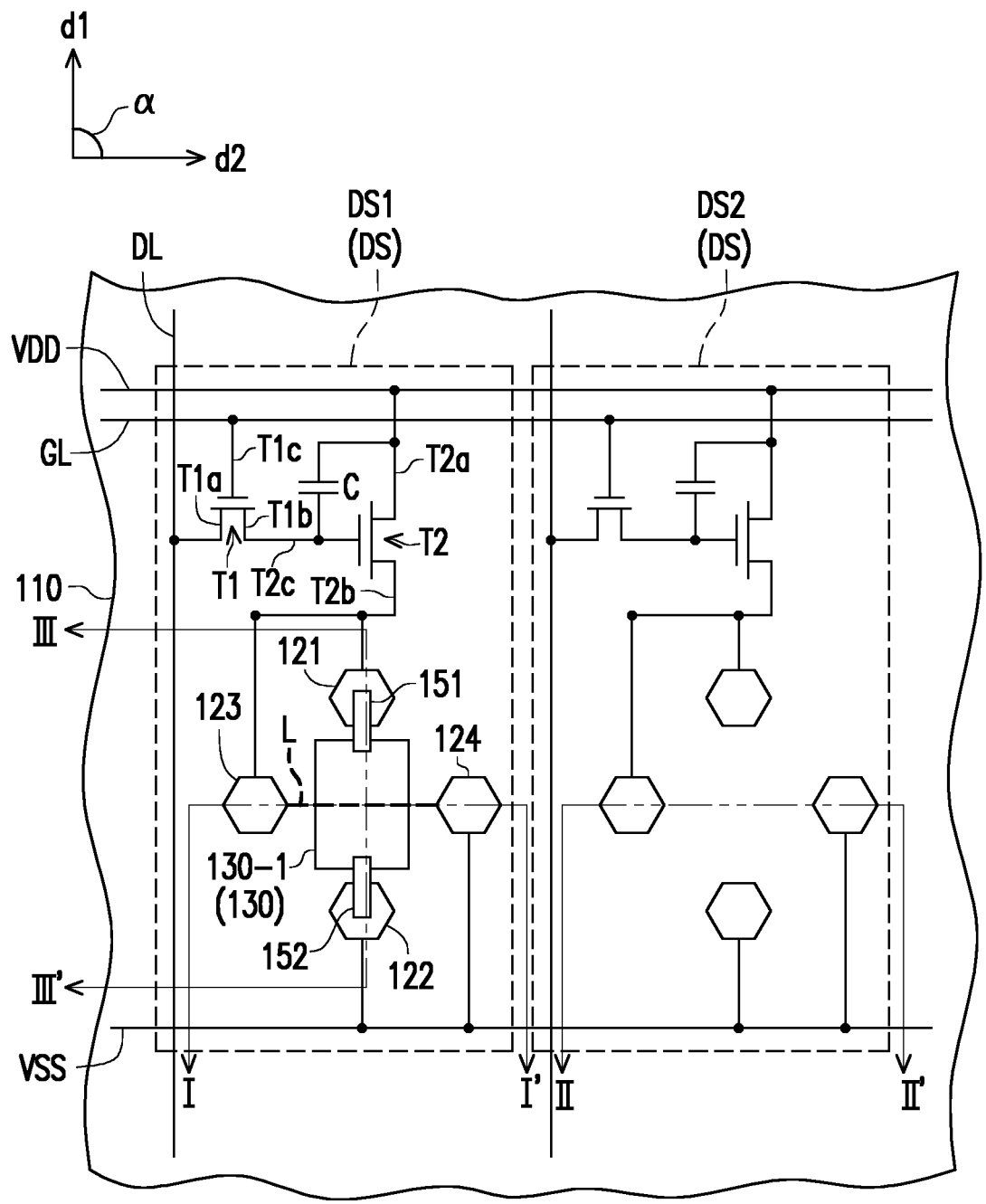
Figure 4B:
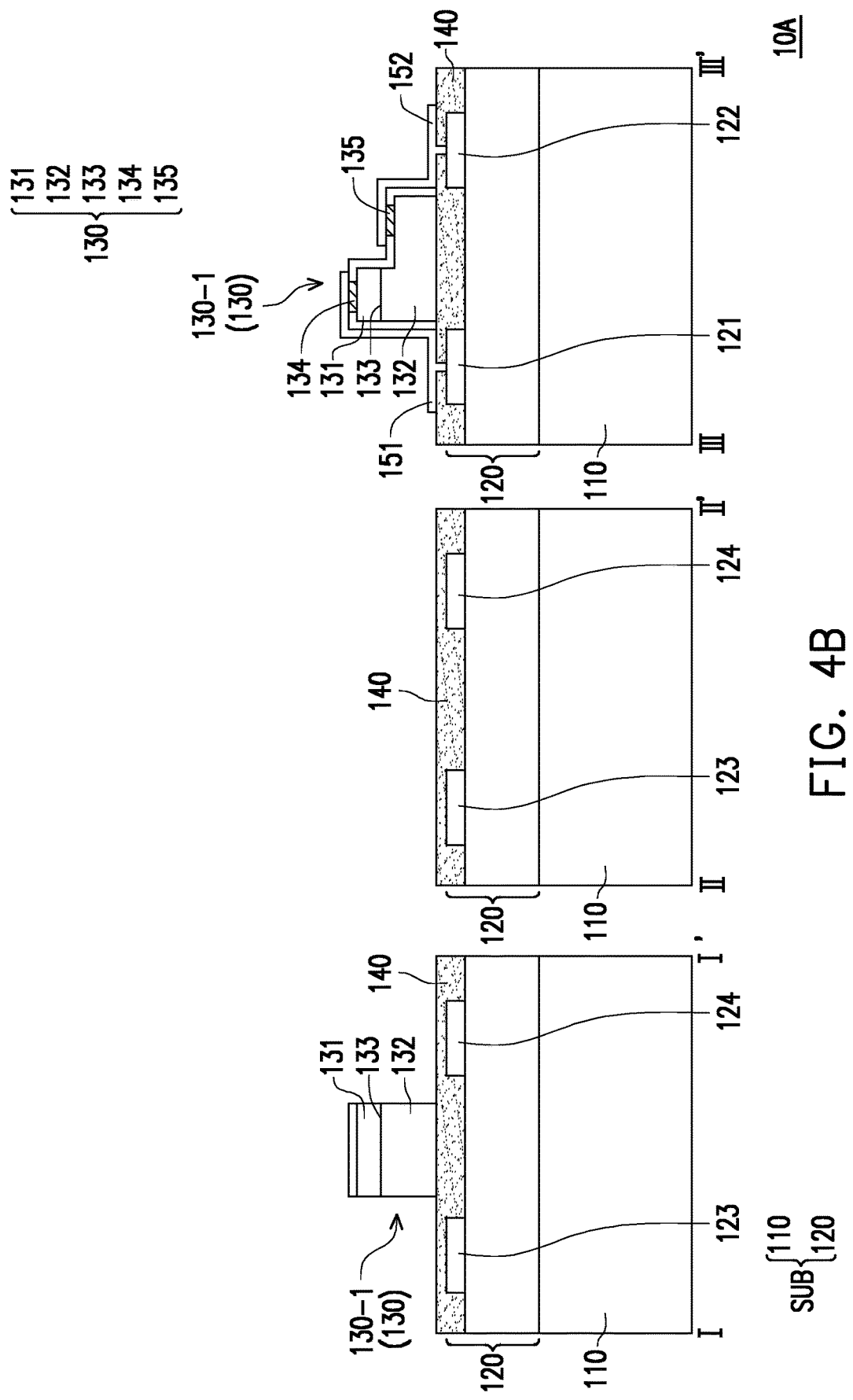

Referring to FIG. 3B and FIG. 4B, subsequently, an extraction element (not shown) is used for transferring a plurality of light emitting diode elements 130 to the driving substrate SUB, and the plurality of light emitting diode elements 130 are electrically connected to a plurality of first pads 121 and a plurality of second pads 122 of the plurality of driving structures DS.

Specifically, in the present embodiment, when the light emitting diode element 130 is transferred, the first electrode 134 and the second electrode 135 of the light emitting diode element 130 are selectively opposite to the driving substrate SUB, and the second type semiconductor layer 132 of the light emitting diode element 130 can be fixed on the fixed layer 140; and then, a first connecting element 151 and a second connecting element 152 are respectively formed on the first electrode 134 of the light emitting diode element 130 and the second electrode 135 of the light emitting diode element 130, wherein the first electrode 134 of the light emitting diode element 130-1 is electrically connected to the first pad 121 of the driving structure DS through the first connecting element 151, and the second electrode 135 of the light emitting diode element 130-1 is electrically connected to the second pad 122 of the driving structure DS through the second connecting element 152.

After the plurality of light emitting diode elements 130 are electrically connected to the plurality of first pads 121 and the plurality of second pads 122 of the driving substrate SUB, a light emitting diode element 130-1 electrically connected to a first pad 121 and a second pad 122 of a driving structure DS1 crosses a line L connecting a third pad 123 and a fourth pad 124 of the driving structure DS1. Therefore, a display apparatus 10A is preliminarily completed.

Subsequently, the display apparatus 10A is checked. After checking, if at least one driving structure DS2 is not provided with the light emitting diode element 130, the repair operations in subsequent FIG. 3C to FIG. 3E and FIG. 4C to FIG. 4E can be performed; or if at least one light emitting diode element 130 of at least one driving structure DS2 is abnormal, after the abnormal light emitting diode element 130 is removed, the repair operations in subsequent FIG. 3C to FIG. 3E and FIG. 4C to FIG. 4E can be performed. The details are described with reference to FIG. 3C to FIG. 3E and FIG. 4C to FIG. 4E below.

Referring to FIG. 3C, FIG. 3D, FIG. 4C and FIG. 4D, after the plurality of light emitting diode elements 130-1 are transferred to the driving substrate SUB, the extraction element (not shown) extracts the plurality of light emitting diode elements 130-2 and performs rotation for an angle. Then, the extraction element is moved towards the driving substrate SUB so as to enable the light emitting diode elements 130-2 to be transferred to the driving structure DS2.

Figure 3C:
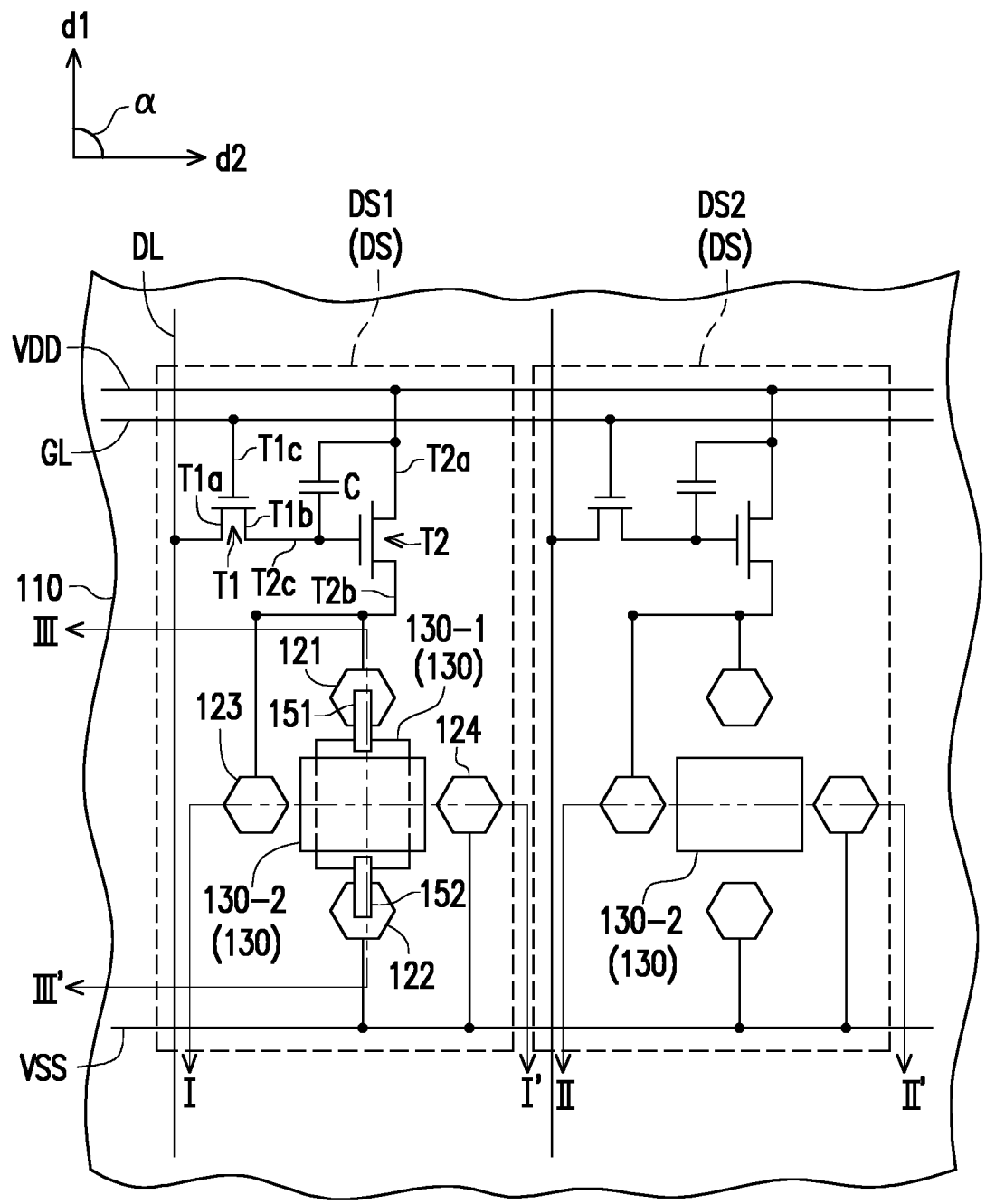
Figure 3D:
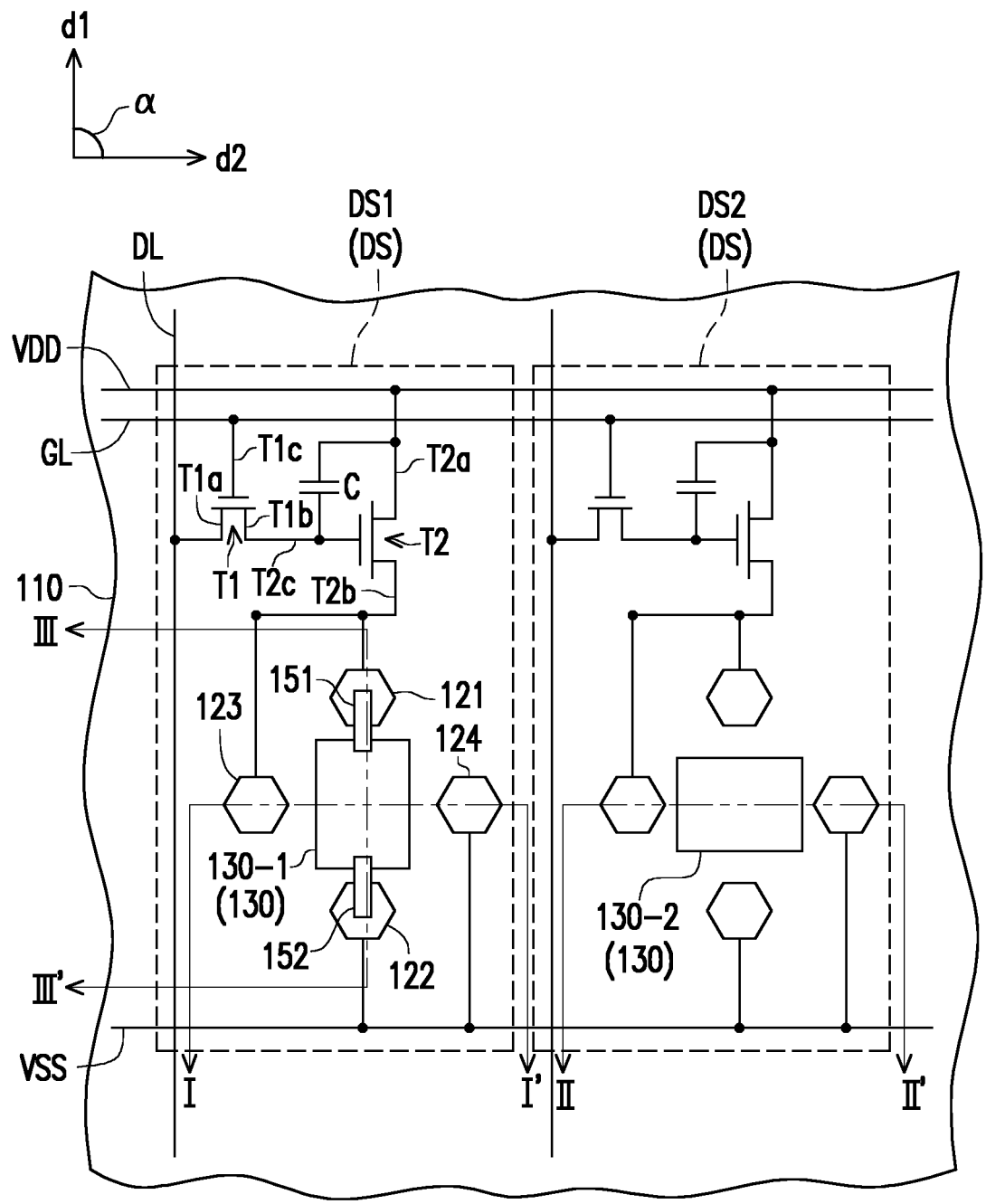
Figure 4C:
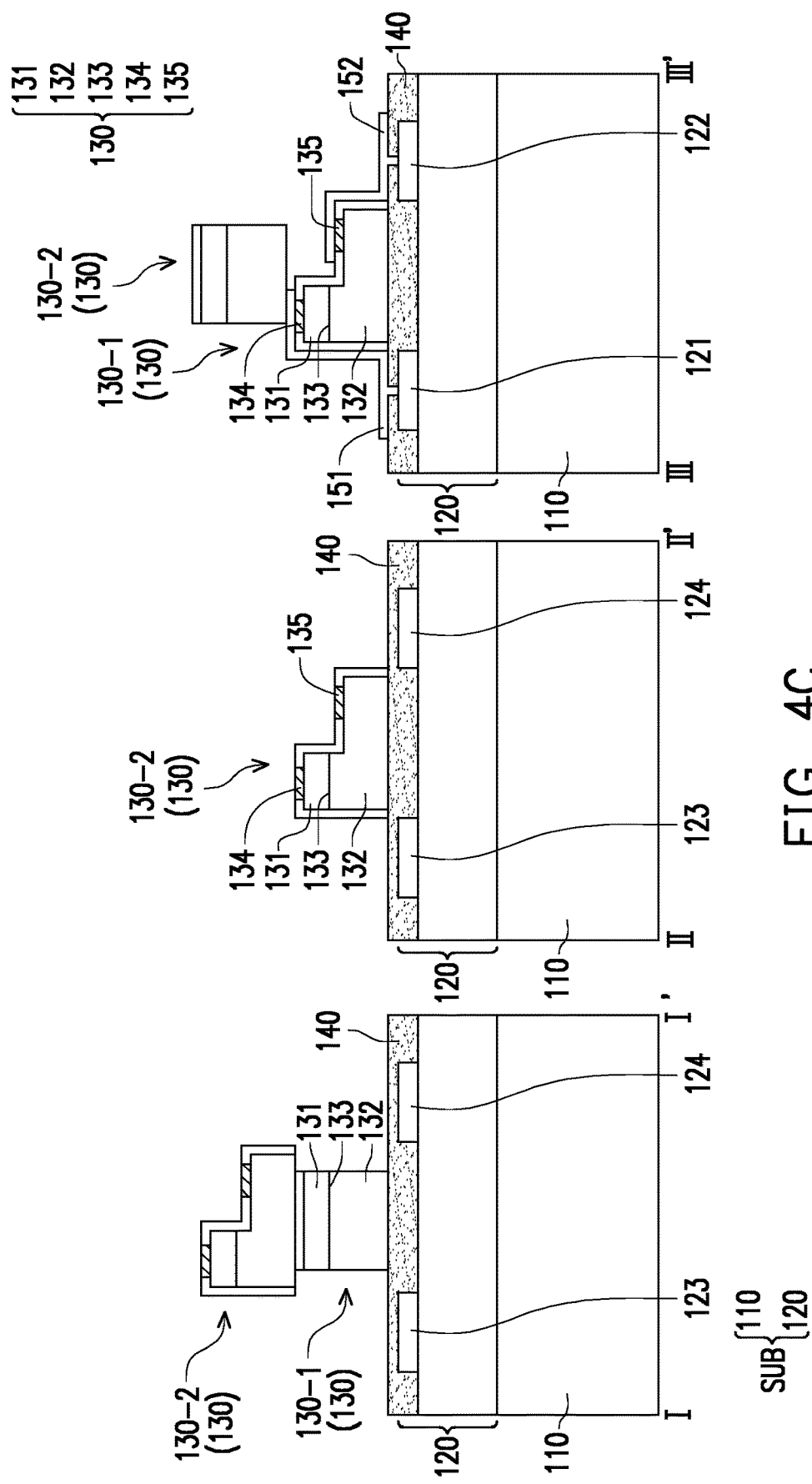
Figure 4D:
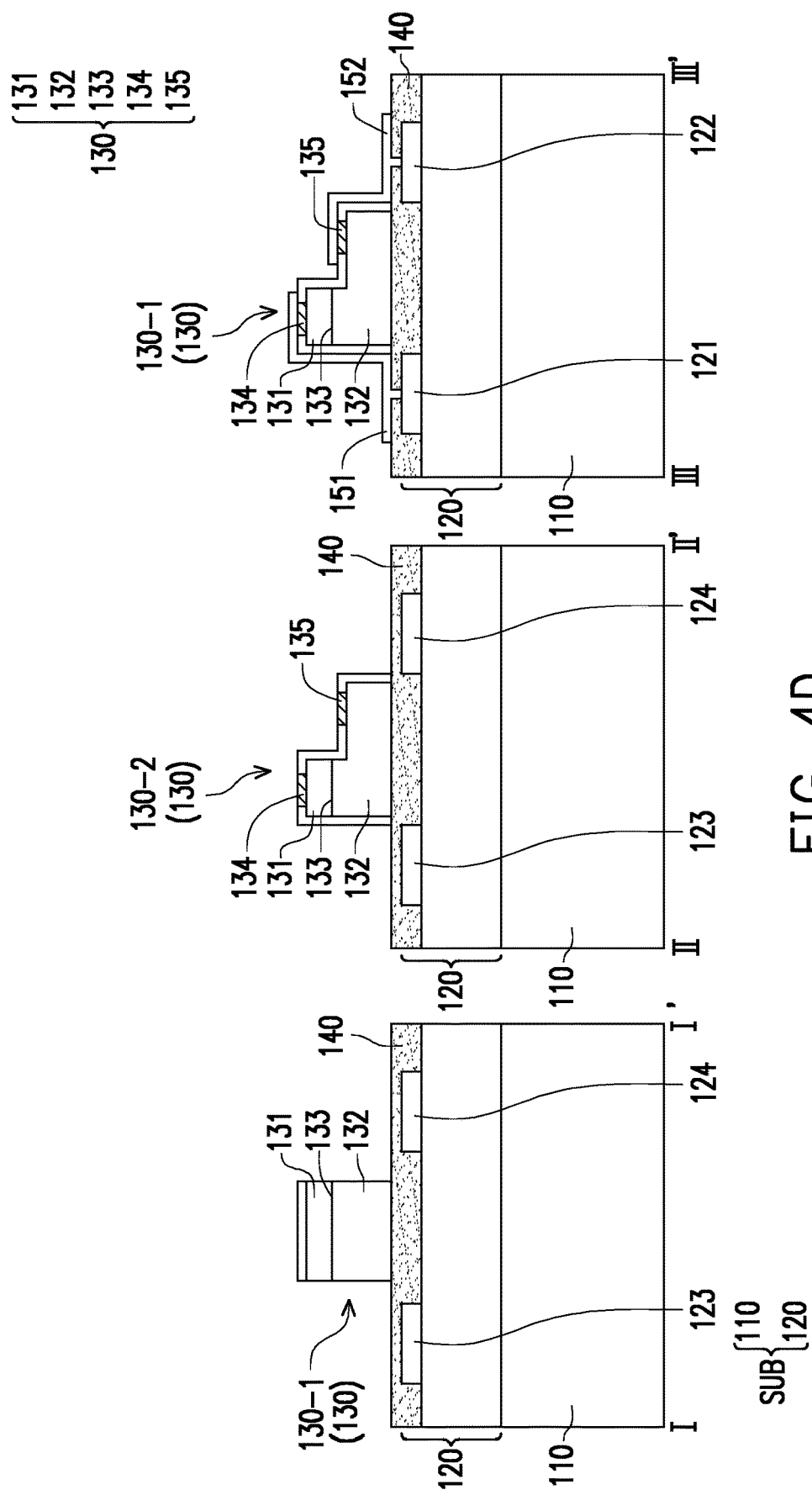

Referring to FIG. 3C and FIG. 4C, similarly, in the process of transferring a light emitting diode element 130-2 to the driving structure DS2, another light emitting diode element 130-2 on the extraction element is blocked by a light emitting diode element 130-1 arranged on the driving substrate SUB. Referring to FIG. 3C, FIG. 3D, FIG. 4C and FIG. 4D, when the light emitting diode element 130-2 which is not blocked by the light emitting diode element 130-1 is transferred to the driving structure DS2 and the extraction element is separated from the driving substrate SUB, the light emitting diode element 130-2 previously blocked by the light emitting diode element 130-1 is taken away by the extraction element and can be reused (for example, in the next repair operation, the light emitting diode element 130-2 is arranged on another driving structure DS2).

Figure 3E:
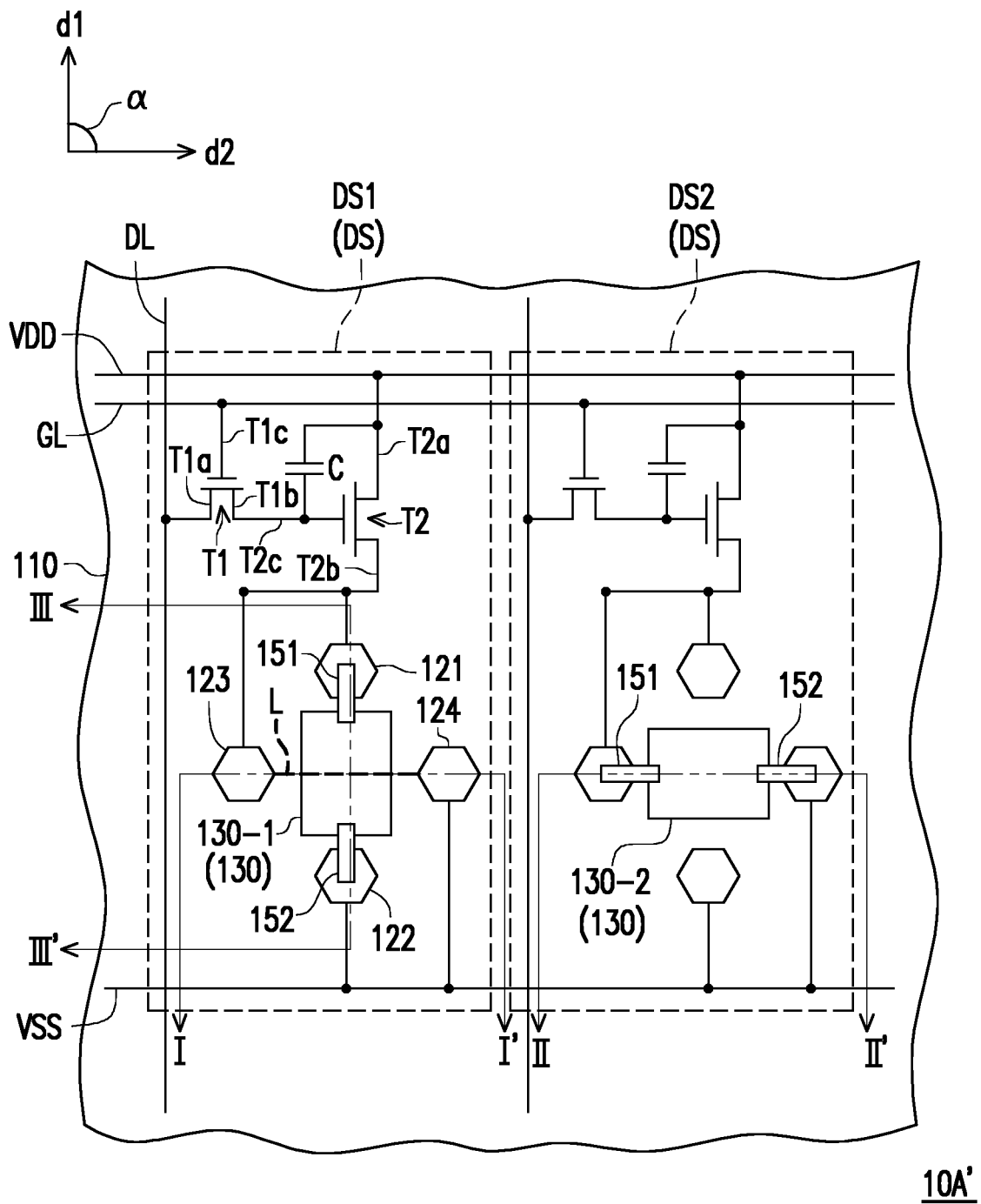
Figure 4E:
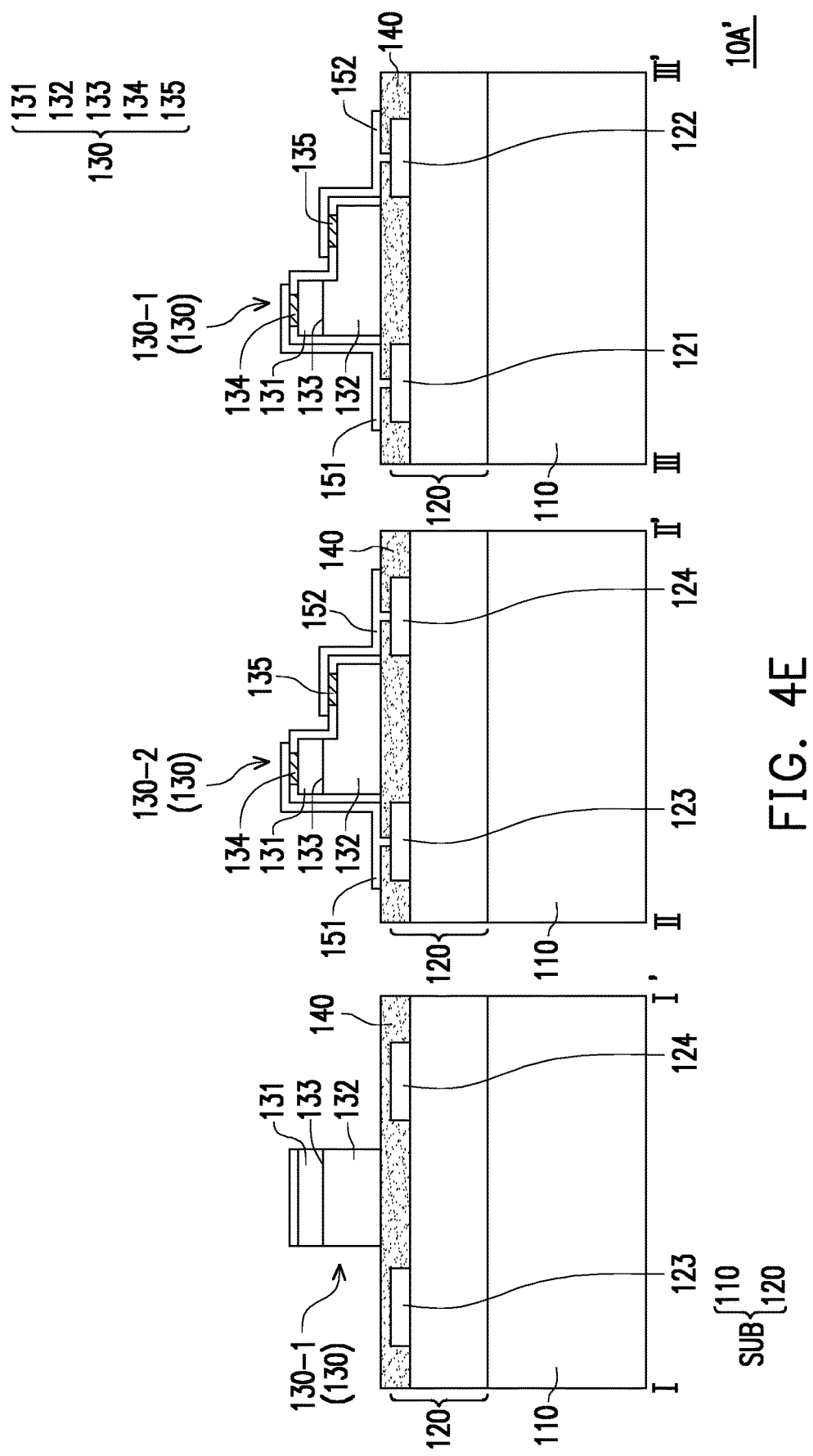

Referring to FIG. 3E and FIG. 4E, subsequently, a first connecting element 151 and a second connecting element 152 are respectively formed on the first electrode 134 of the light emitting diode element 130-2 and the second electrode 135 of the light emitting diode element 130-2, wherein the first electrode 134 of the light emitting diode element 130-2 is electrically connected to the third pad 123 of the driving structure DS2 through the first connecting element 151, and the second electrode 135 of the light emitting diode element 130-2 is electrically connected to the fourth pad 124 of the driving structure DS2 through the second connecting element 152. Therefore, a repaired display apparatus 10A' is completed.

The display apparatus 10A' according to the present embodiment is similar to the above display apparatus 10', and the difference between the display apparatus 10A' and the display apparatus 10' is as follows: in the present embodiment, the first type semiconductor layer 131 of the light emitting diode element 130-1 is arranged between the first electrode 134 of the light emitting diode element 130-1 and the first pad 121, and the second type semiconductor layer 132 of the light emitting diode element 130-1 is arranged between the second electrode 135 of the light emitting diode element 130-1 and the second pad 122; and the first type semiconductor layer 131 of the light emitting diode element 130-2 is arranged between the first electrode 134 of the light emitting diode element 130-2 and the third pad 123, and the second type semiconductor layer 132 of the light emitting diode element 130-2 is arranged between the second electrode 135 of the light emitting diode element 130-2 and the fourth pad 124.

FIG. 5A to FIG. 5E are schematic top views of manufacturing processes of a display apparatus according to a third embodiment of the present invention.

FIG. 6A to FIG. 6E are schematic cross-sectional views of the manufacturing processes of the display apparatus according to the third embodiment of the present invention. FIG. 6A to FIG. 6E are respectively corresponding to a section line I-I', a section line II-II' and a section line III-III' in FIG. 5A to FIG. 5E.

The display apparatuses 10B and 10B' according to the third embodiment and the manufacturing method thereof are similar to the display apparatuses 10 and 10' according to the first embodiment and the manufacturing method thereof, and the difference therebetween is as follows: in the second embodiment, the light emitting diode element 130 is vertical, and the manner in which the vertical light emitting diode element 130 is electrically connected to the driving substrate SUB is slightly different from the above embodiment. The details are described with reference to FIG. 5A to FIG. 5E and FIG. 6A to FIG. 6E below.

Figure 5A:
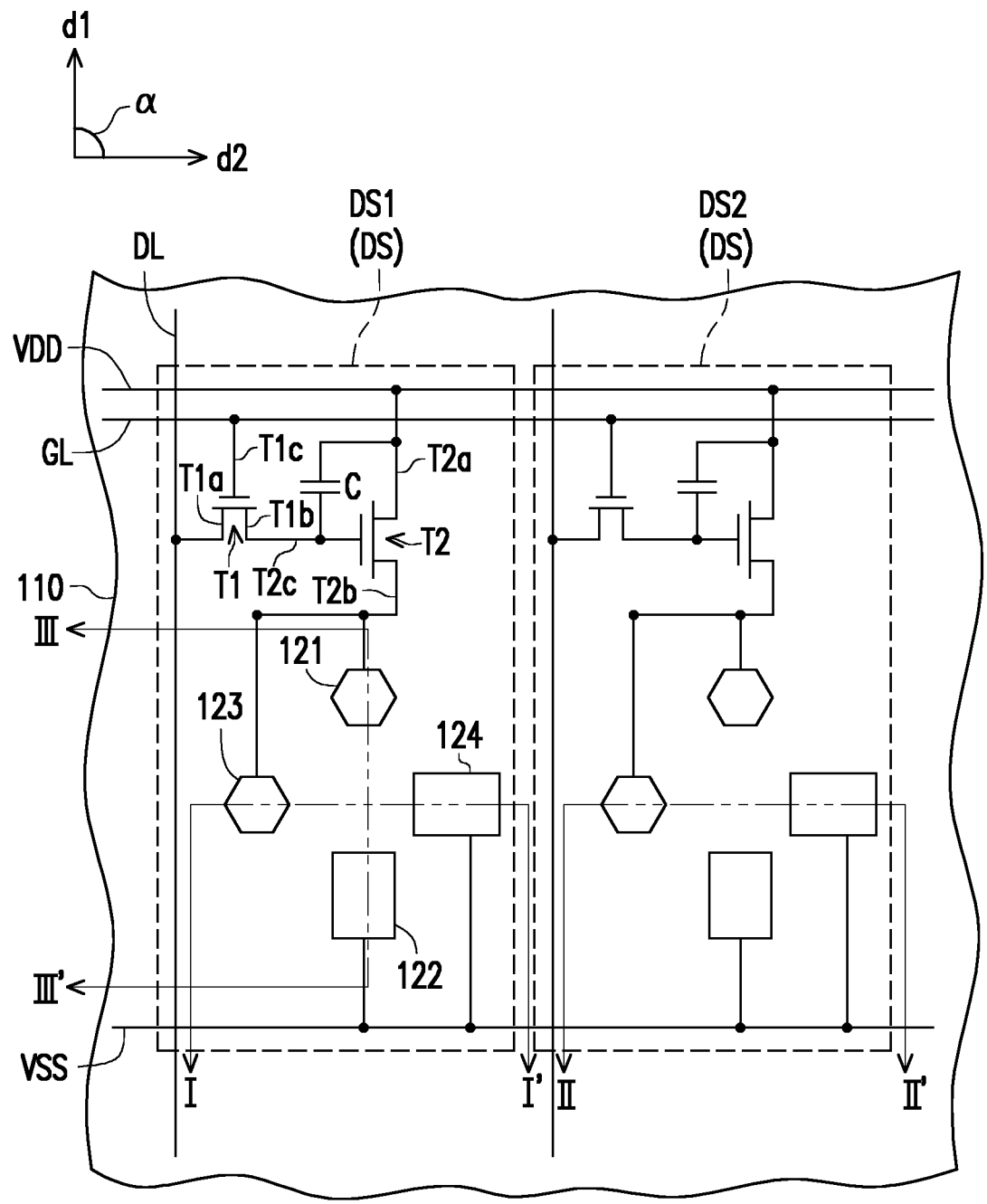
FIG. 5A to FIG. 5E are schematic top views of manufacturing processes of a display apparatus according to a third embodiment of the present invention.
Figure 6A:
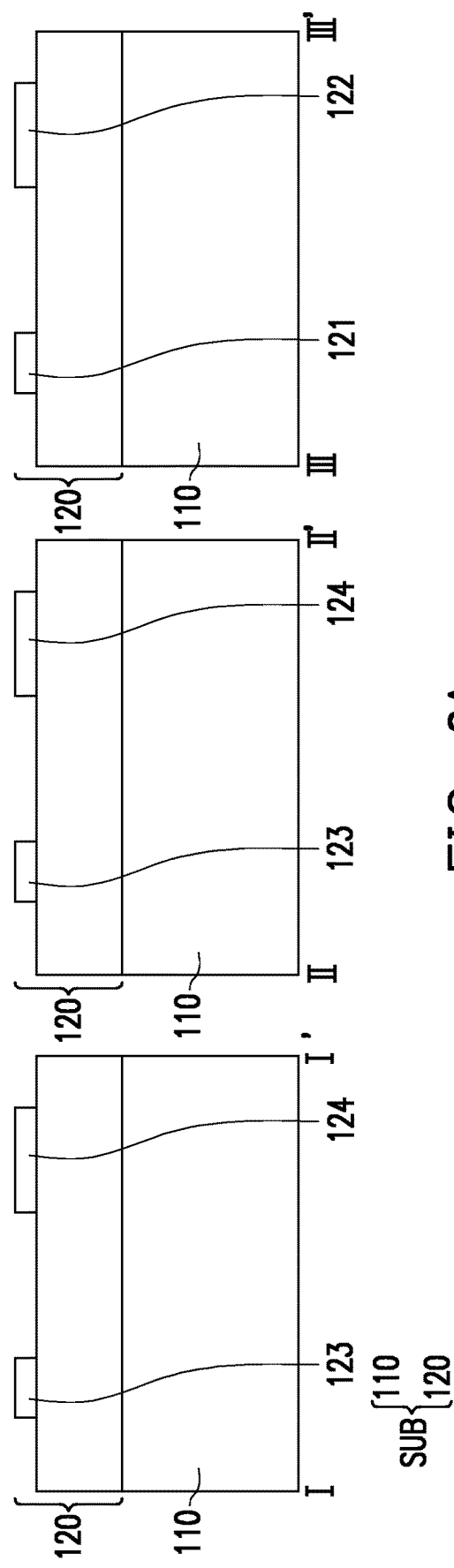
FIG. 6A to FIG. 6E are schematic cross-sectional views of the manufacturing processes of the display apparatus according to the third embodiment of the present invention.

Referring to FIG. 5A and FIG. 6A, firstly, a driving substrate SUB is provided. The driving substrate SUB has a plurality of driving structures DS.

Figure 5B:
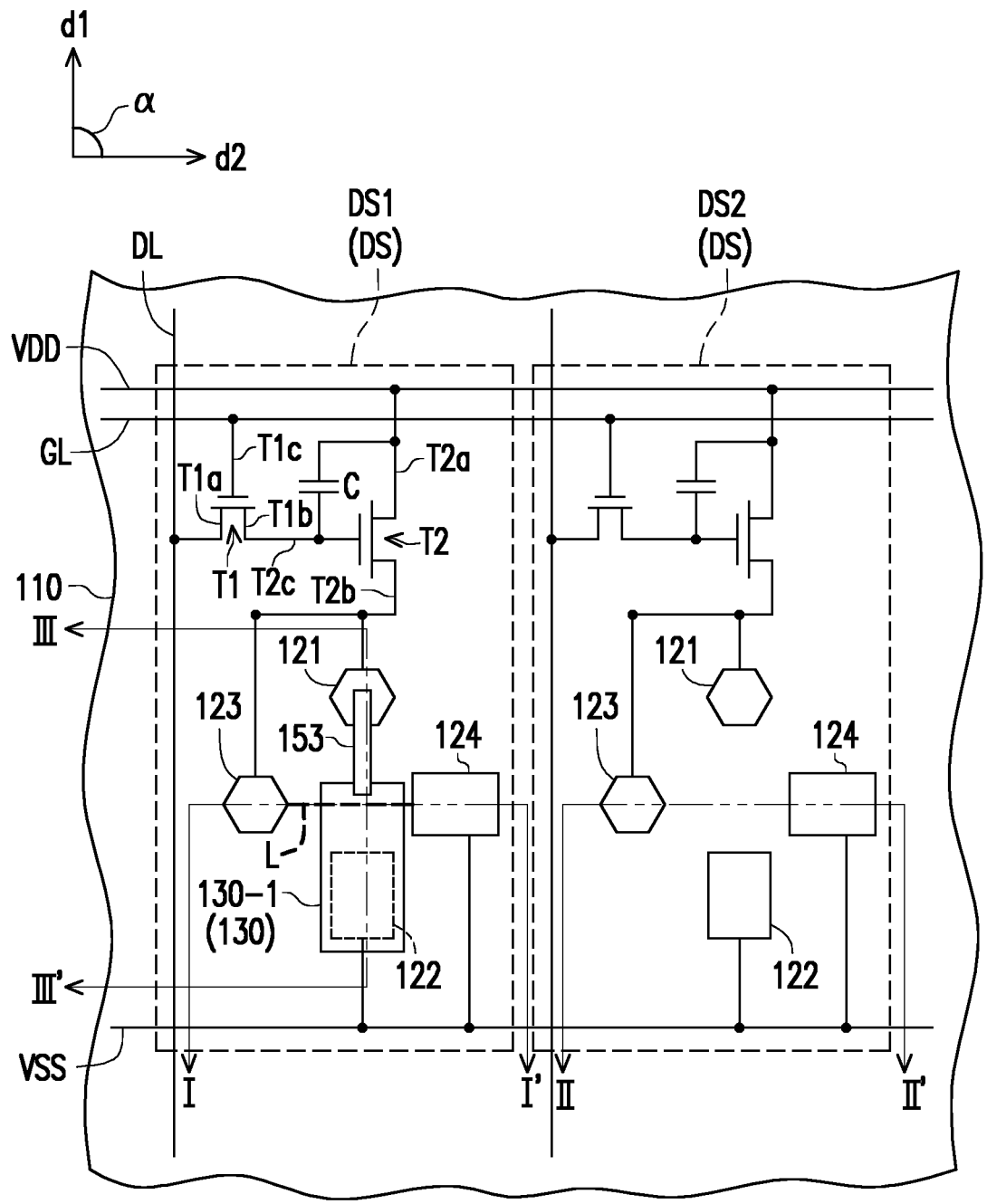
Figure 6B:
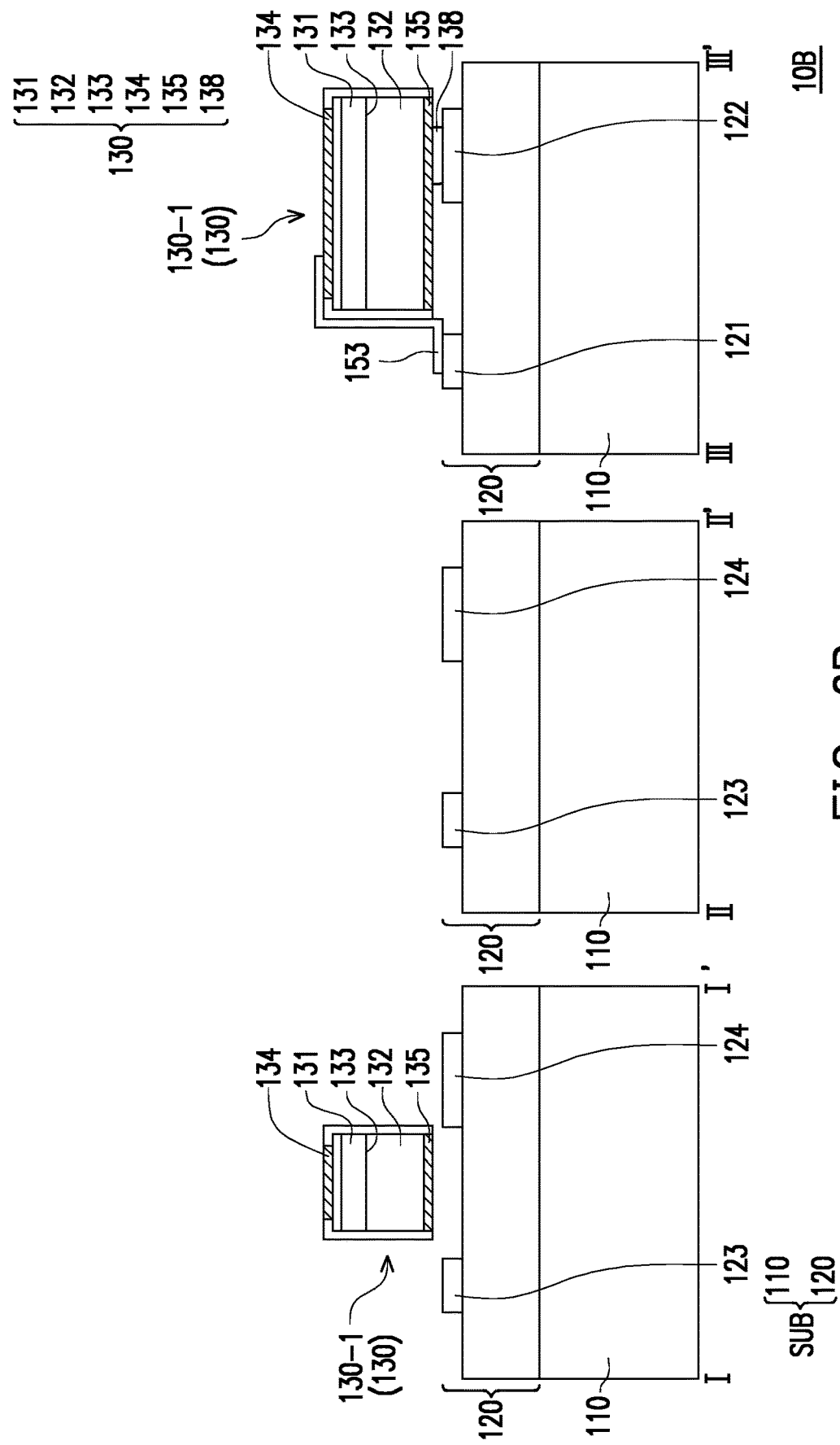

Referring to FIG. 5B and FIG. 6B, subsequently, an extraction element (not shown) is used for transferring a plurality of light emitting diode elements 130 to the driving substrate SUB, and the plurality of light emitting diode elements 130 are electrically connected to a plurality of first pads 121 and a plurality of second pads 122 of the plurality of driving structures DS.

Specifically, in the present embodiment, when the light emitting diode element 130 is transferred, a conductive substance 138 (including but not limited to solder balls, silver adhesives, and anisotropic conductive adhesives) can be arranged on an electrode (including but not limited to the second electrode 135) of the light emitting diode element 130. When the light emitting diode element 130-1 on the extraction element is close to the driving substrate SUB, the conductive substance 138 on the electrode (including but not limited to the second electrode 135) of the light emitting diode element 130-1 can be connected with a pad (including but not limited to the second pad 122) of the first pad set of the driving substrate SUB, so that the light emitting diode element 130-1 is electrically connected to the driving substrate SUB.

Subsequently, a connecting element 153 is formed on another electrode (including but not limited to the first electrode 134) of the light emitting diode element 130, wherein another electrode (including but not limited to the first electrode 134) of the light emitting diode element 130 is electrically connected to another pad (including but not limited to the first pad 121) of the first pad set of the driving substrate SUB through the connecting element 153. Therefore, a display apparatus 10B is preliminarily completed.

Subsequently, the display apparatus 10B is checked. After checking, if at least one driving structure DS2 is not provided with the light emitting diode element 130, the repair operations in subsequent FIG. 5C to FIG. 5E and FIG. 6C to FIG. 6E can be performed; or if at least one light emitting diode element 130 of at least one driving structure DS2 is abnormal, after the abnormal light emitting diode element 130 is removed, the repair operations in subsequent FIG. 5C to FIG. 5E and FIG. 6C to FIG. 6E can be performed. The details are described with reference to FIG. 5C to FIG. 5E and FIG. 6C to FIG. 6E below.

Referring to FIG. 5C, FIG. 5D, FIG. 6C and FIG. 6D, after the plurality of light emitting diode elements 130-1 are transferred to the driving substrate SUB, the extraction element (not shown) extracts the plurality of light emitting diode elements 130-2 and performs rotation for an angle. Then, the extraction element is moved towards the driving substrate SUB so as to enable the light emitting diode elements 130-2 to be transferred to the driving structure DS2.

In the present embodiment, when the plurality of light emitting diode elements 130-2 are transferred, at least one light emitting diode element 130-2 can be electrically connected with the driving structure DS2.

Specifically, in the present embodiment, when the light emitting diode element 130-2 is transferred, a conductive substance 138 (including but not limited to solder balls, silver adhesives, and anisotropic conductive adhesives) can be arranged on an electrode (including but not limited to the second electrode 135) of the light emitting diode element 130-2. When the light emitting diode element 130-2 on the extraction element is close to the driving substrate SUB, the conductive substance 138 on the electrode (including but not limited to the second electrode 135) of the light emitting diode element 130-2 can be connected with a pad (including but not limited to the fourth pad 124) of the second pad set of the driving substrate SUB, so that the light emitting diode element 130-2 is electrically connected to the driving substrate SUB.

Figure 5C:
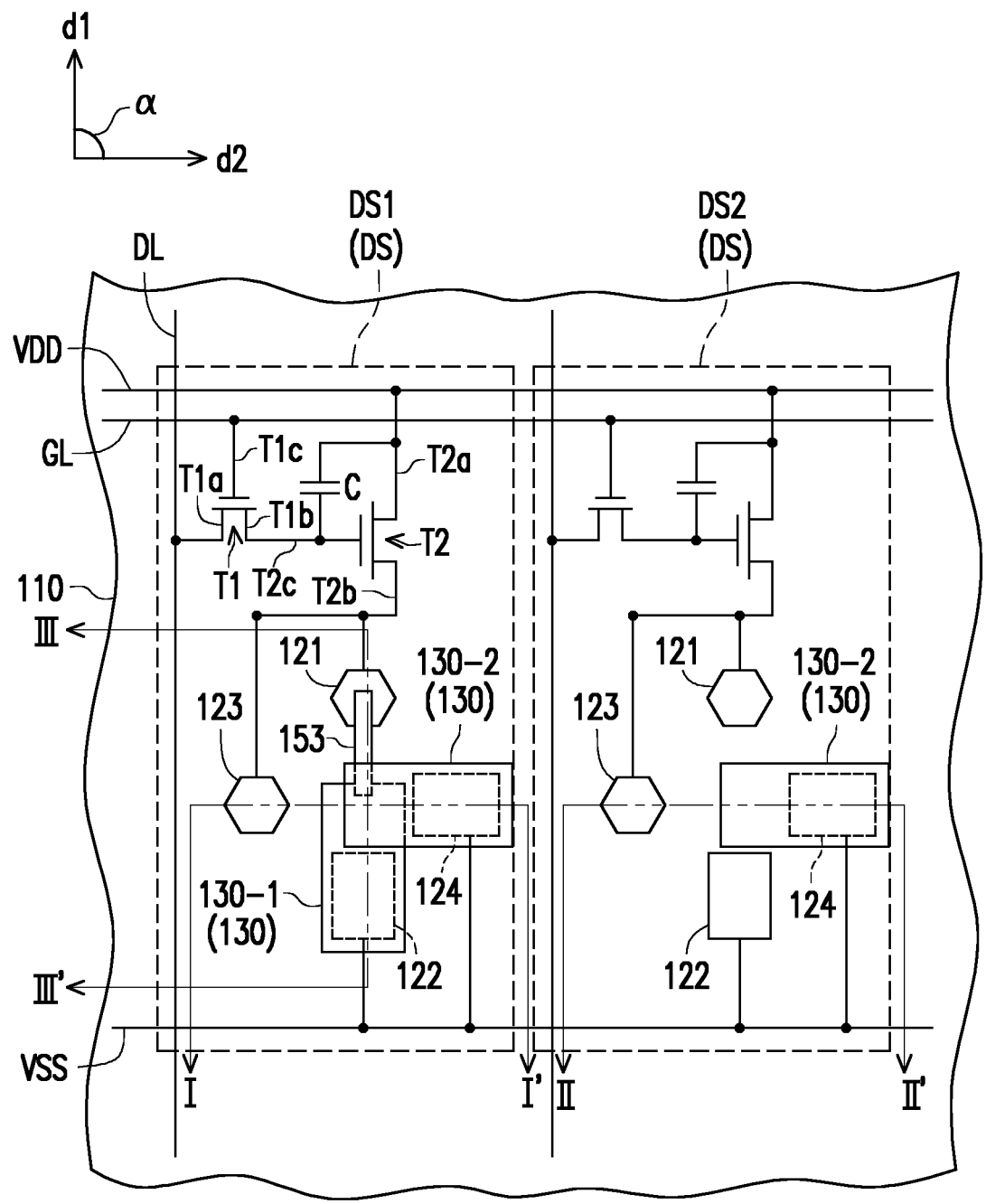
Figure 5D:
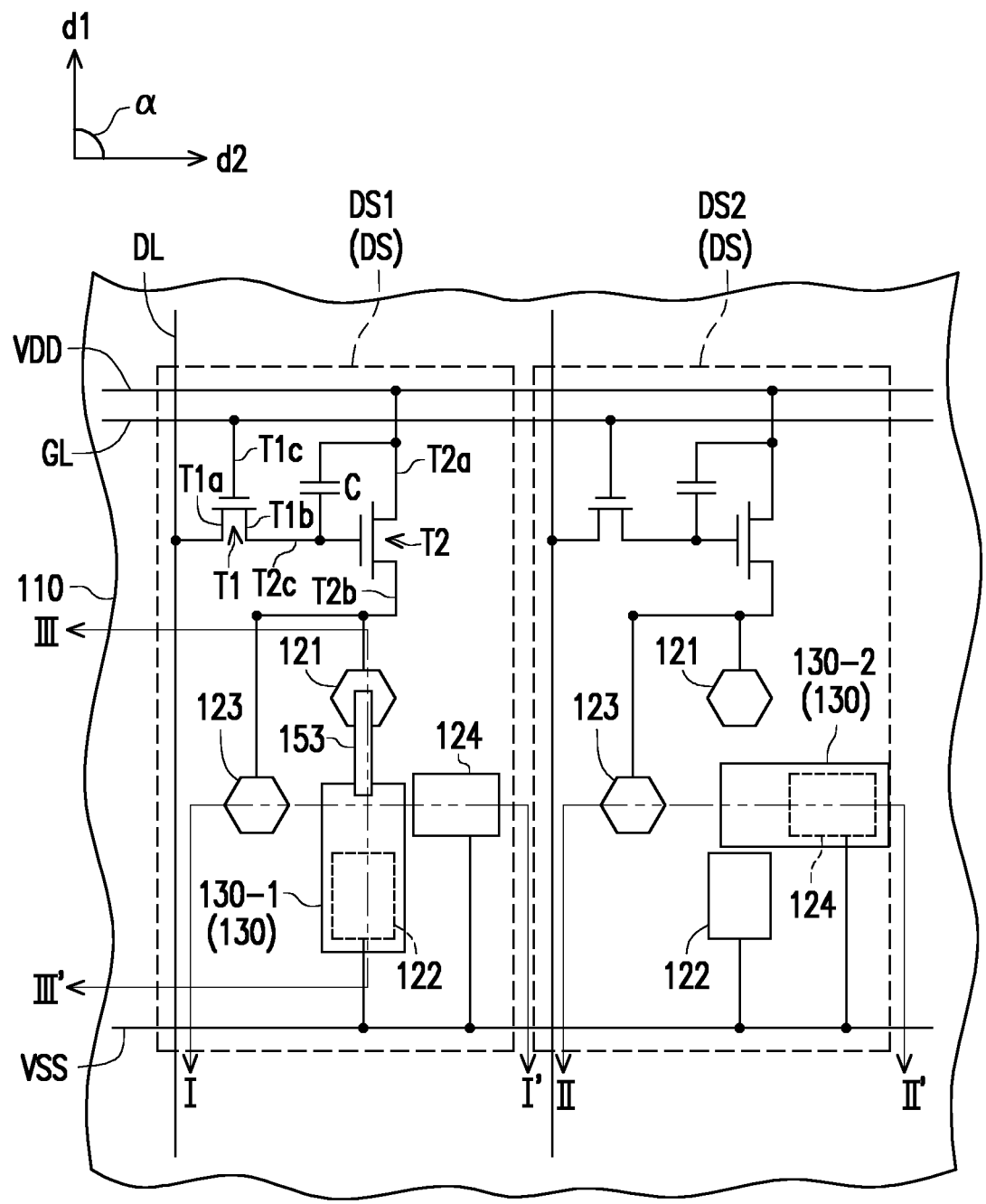
Figure 6C:
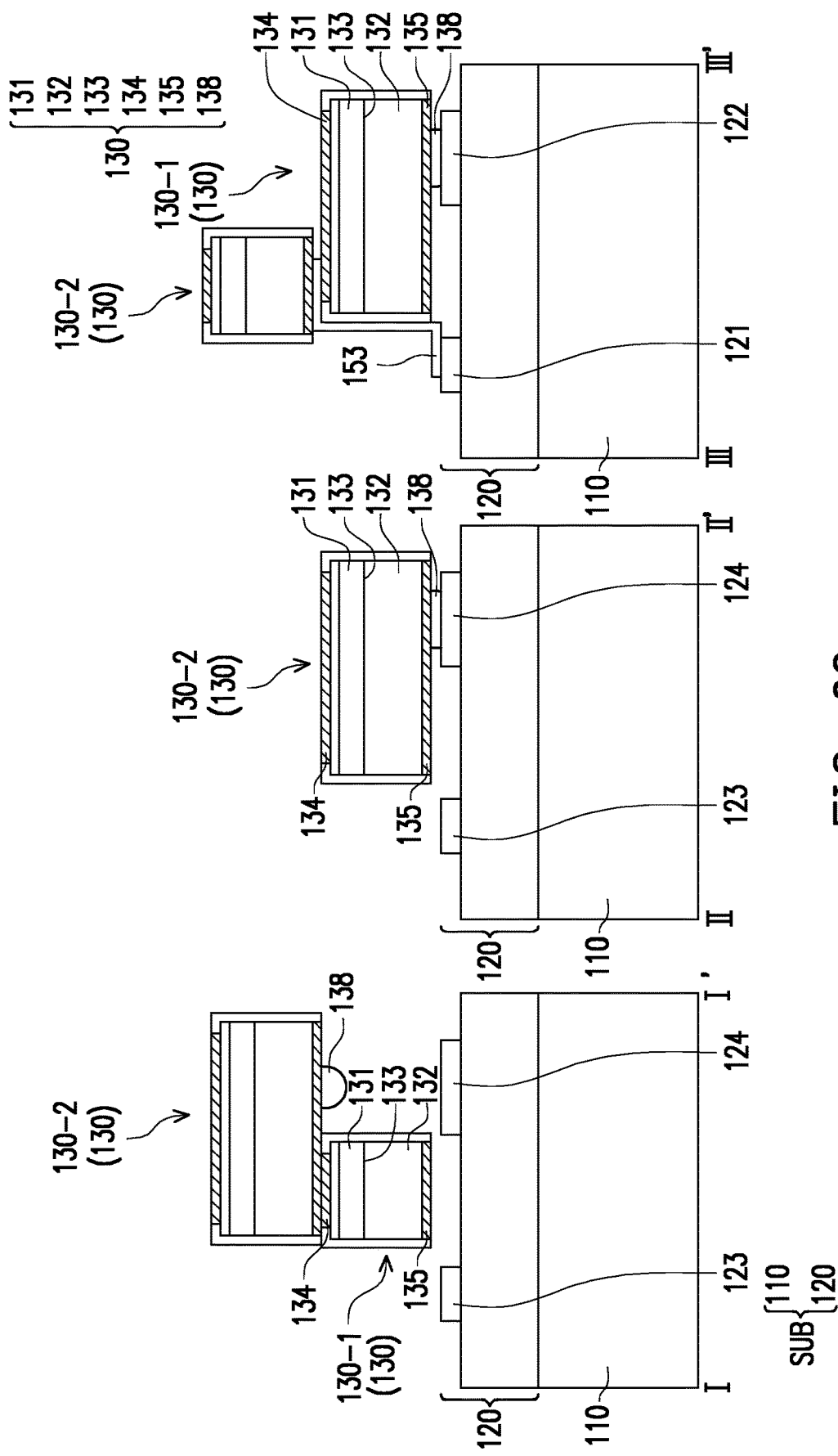
Figure 6D:
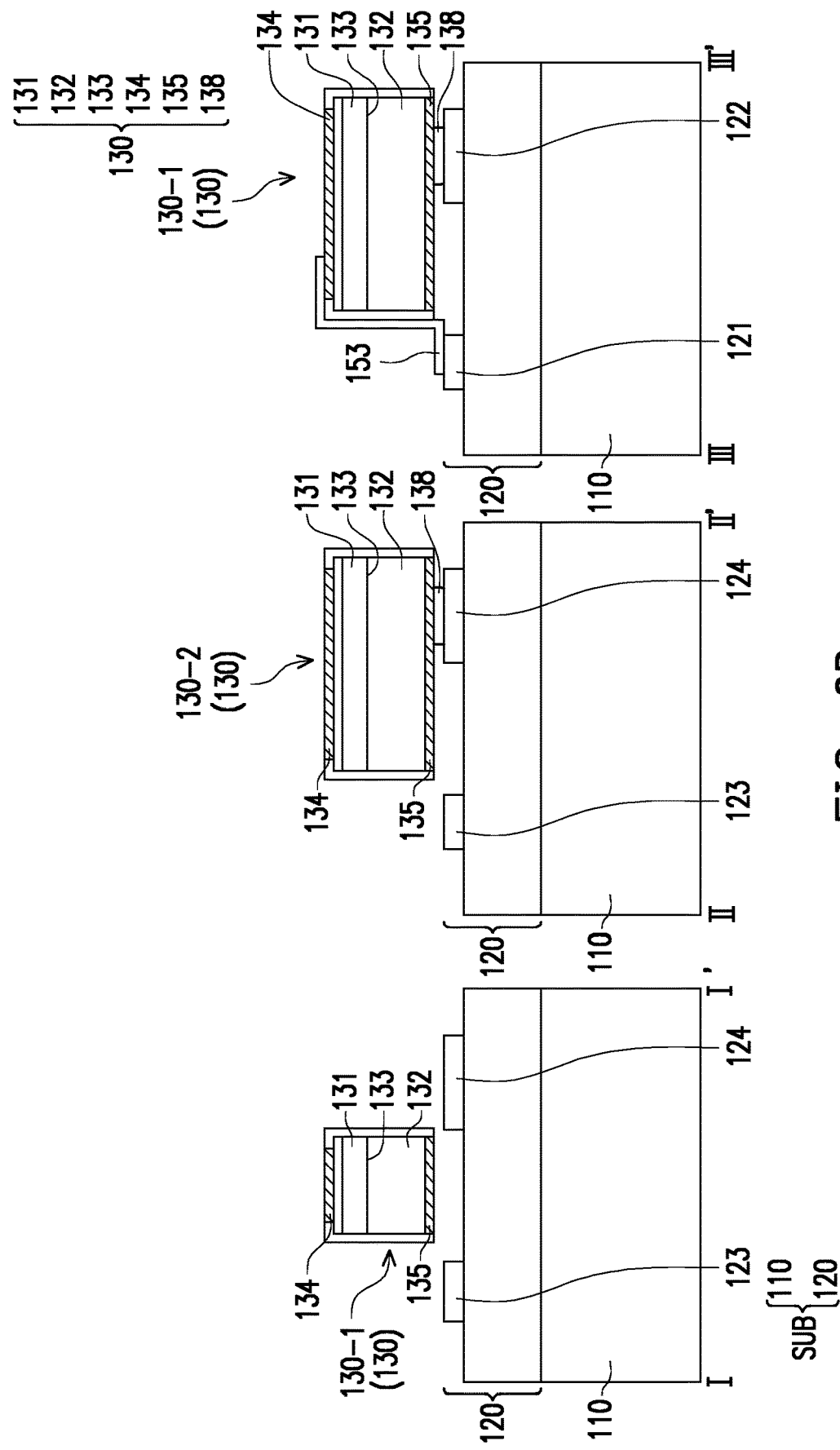

Referring to FIG. 5C and FIG. 6C, similarly, in the process of transferring a light emitting diode element 130-2 to the driving structure DS2, another light emitting diode element 130-2 on the extraction element is blocked by a light emitting diode element 130-1 arranged on the driving substrate SUB. Referring to FIG. 5C, FIG. 5D, FIG. 6C and FIG. 6D, when the light emitting diode element 130-2 which is not blocked by the light emitting diode element 130-1 is transferred to the driving structure DS2 and the extraction element is separated from the driving substrate SUB, the light emitting diode element 130-2 previously blocked by the light emitting diode element 130-1 is taken away by the extraction element and can be reused (for example, in the next repair operation, the light emitting diode element 130-2 is arranged on another driving structure DS2).

Figure 5E:
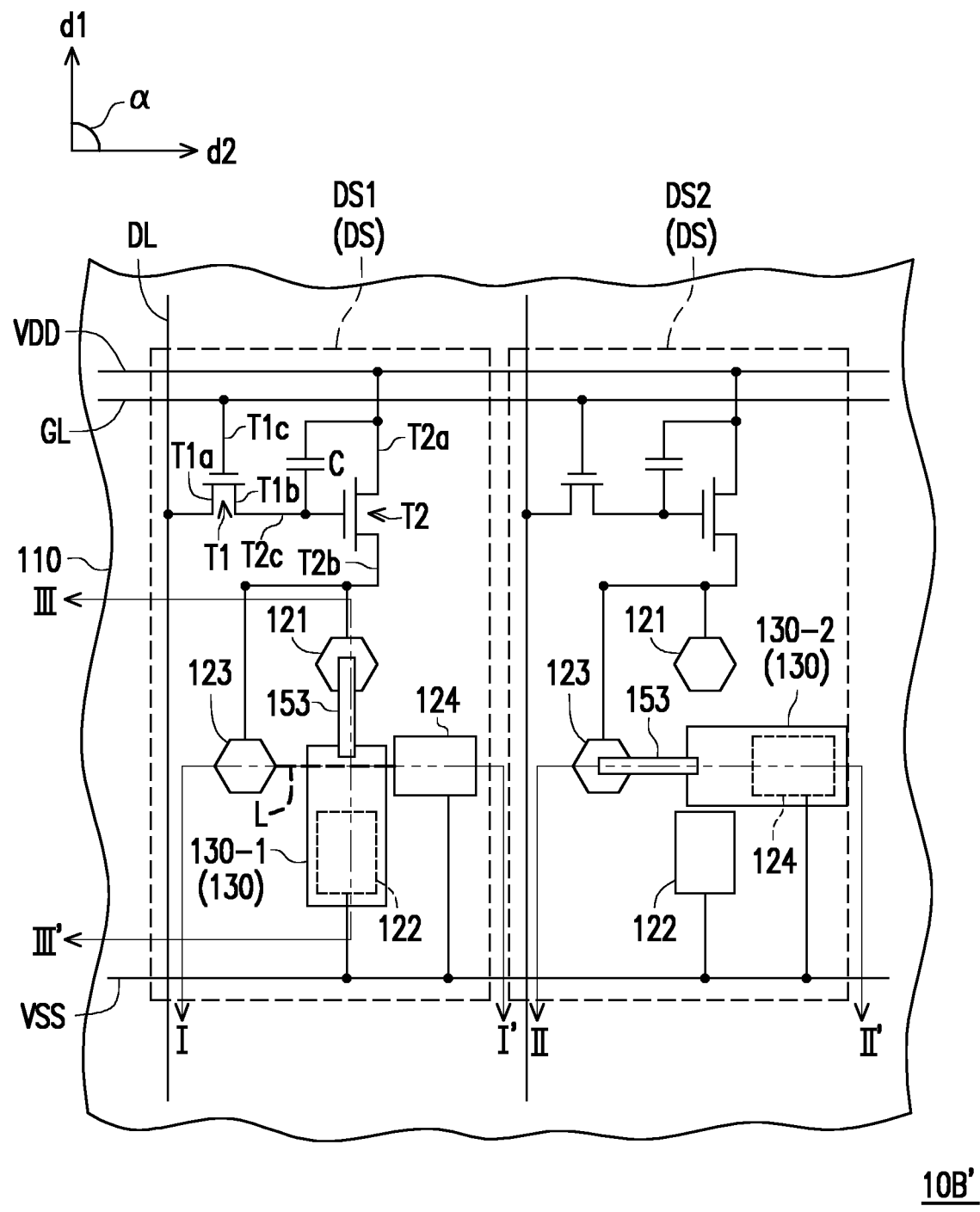
Figure 6E:
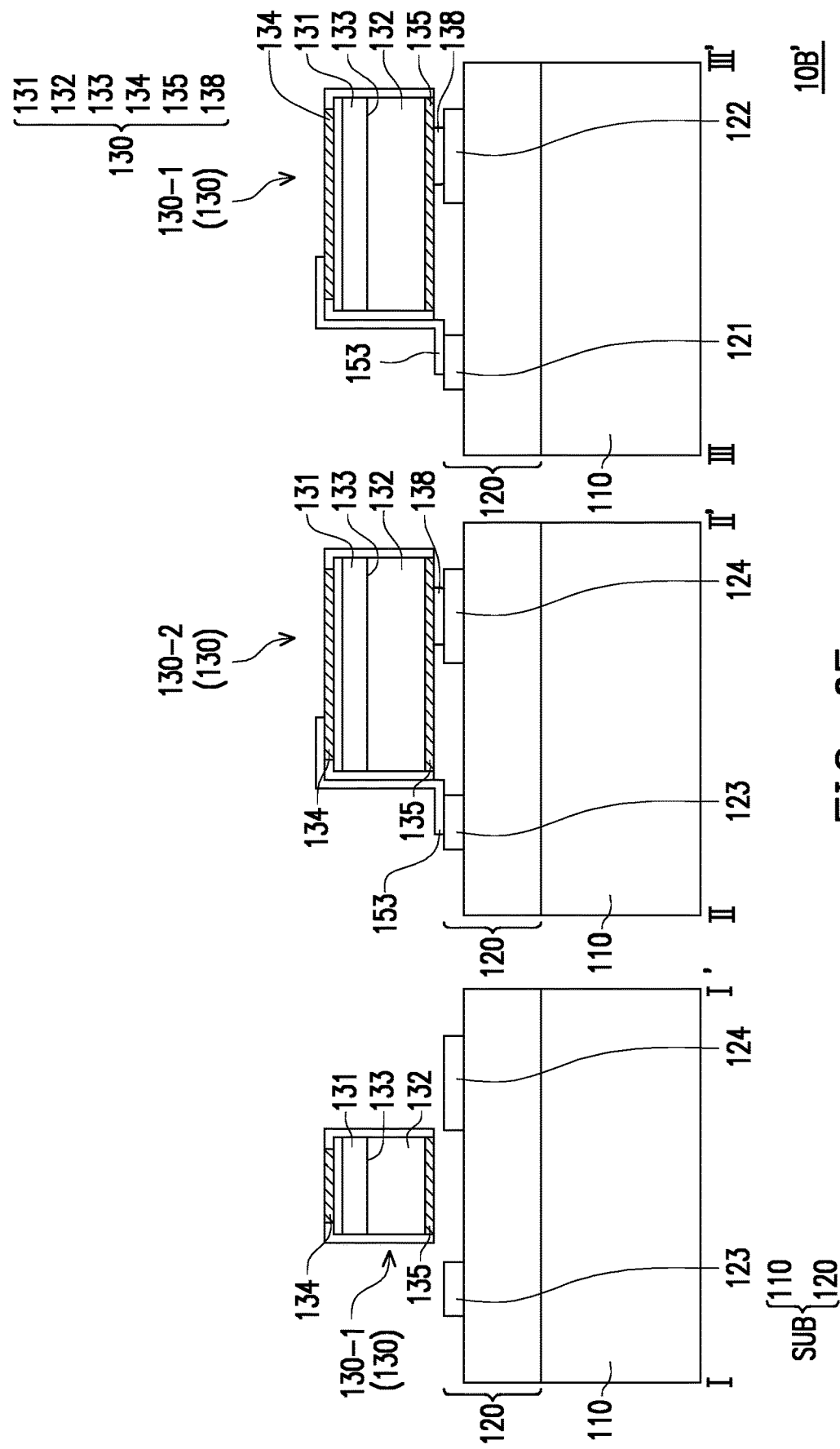
Figure 7A:
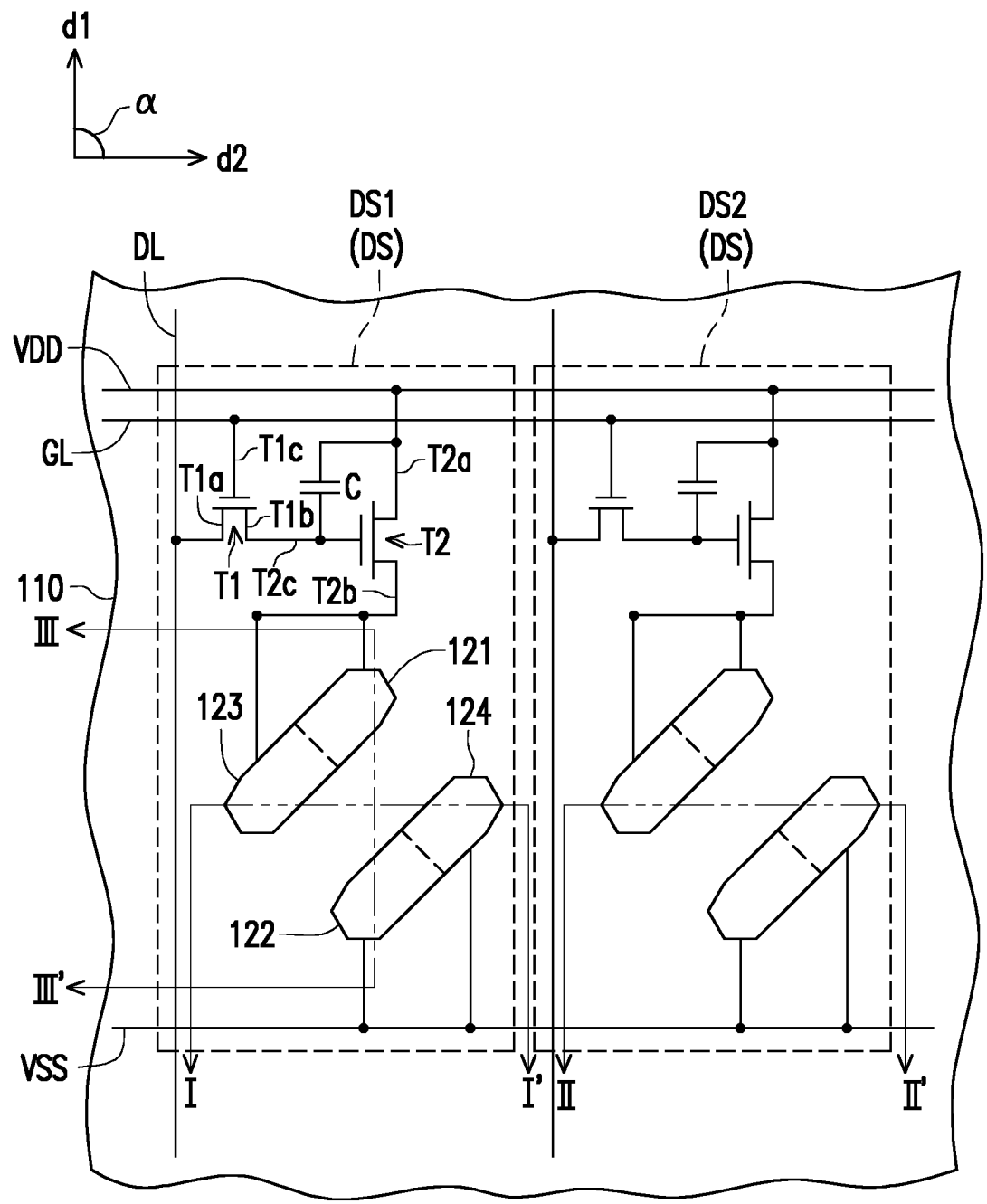
FIG. 7A to FIG. 7D are schematic top views of manufacturing processes of a display apparatus according to a fourth embodiment of the present invention.
Figure 7B:
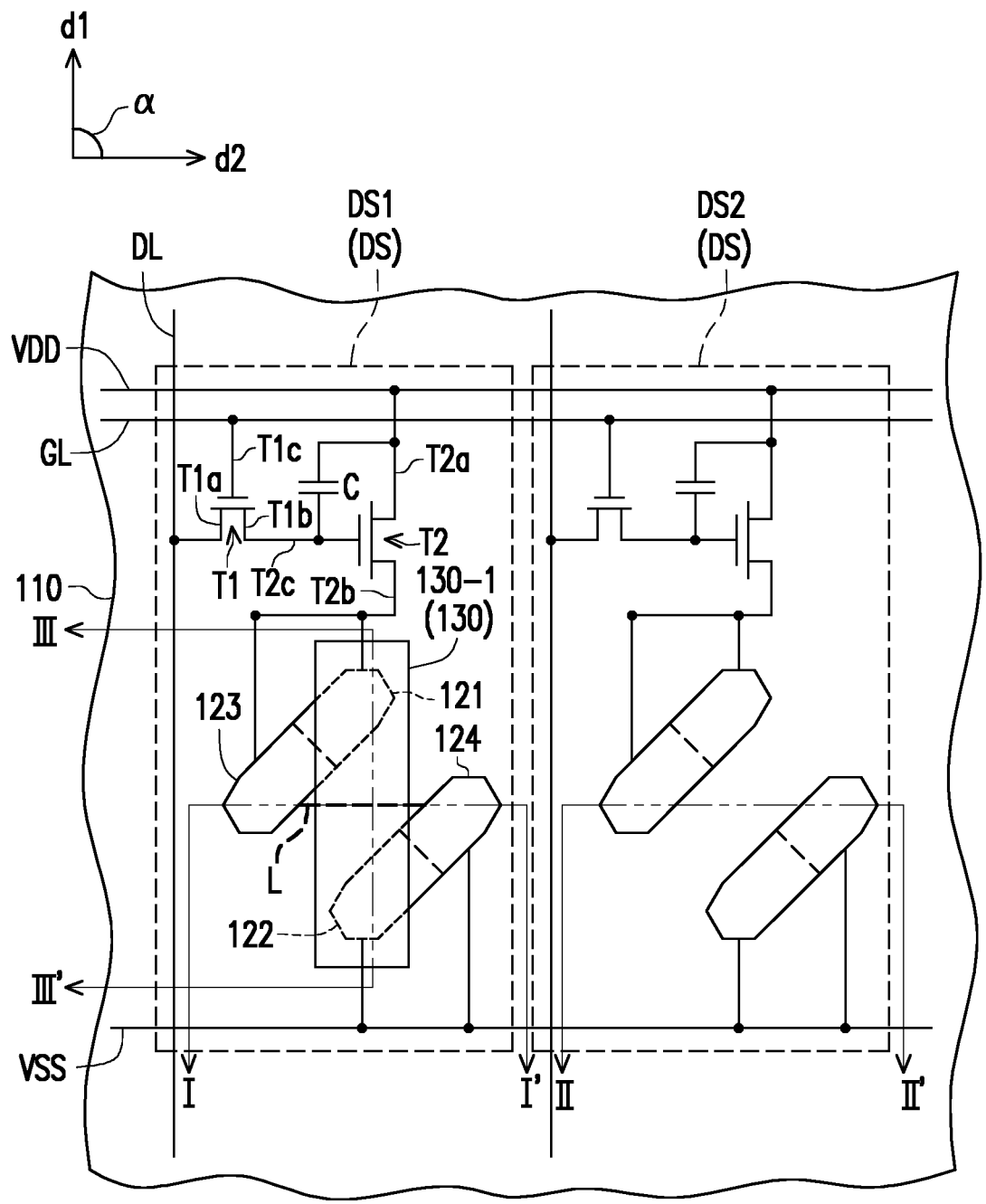
Figure 7C:
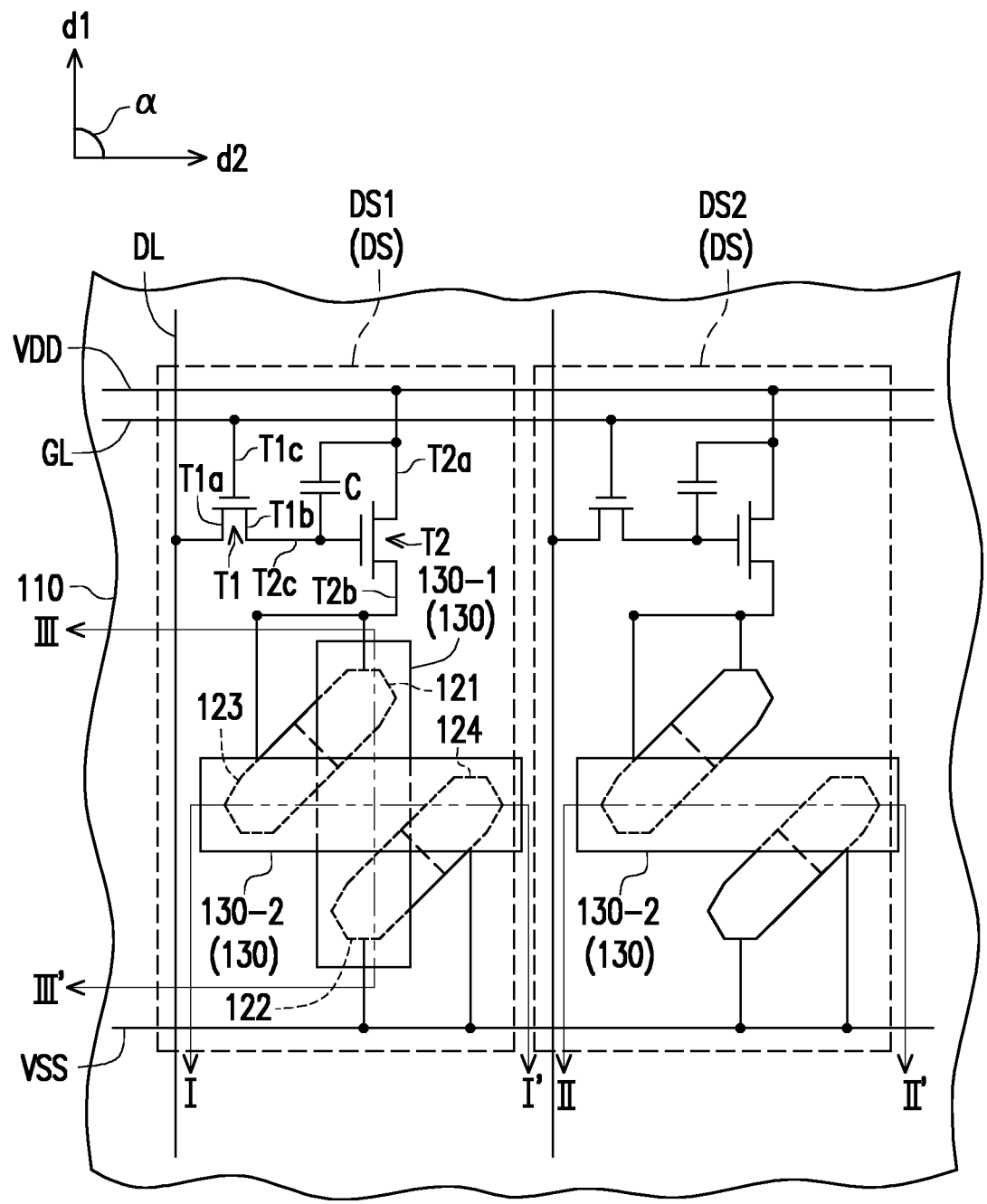
Figure 7D:
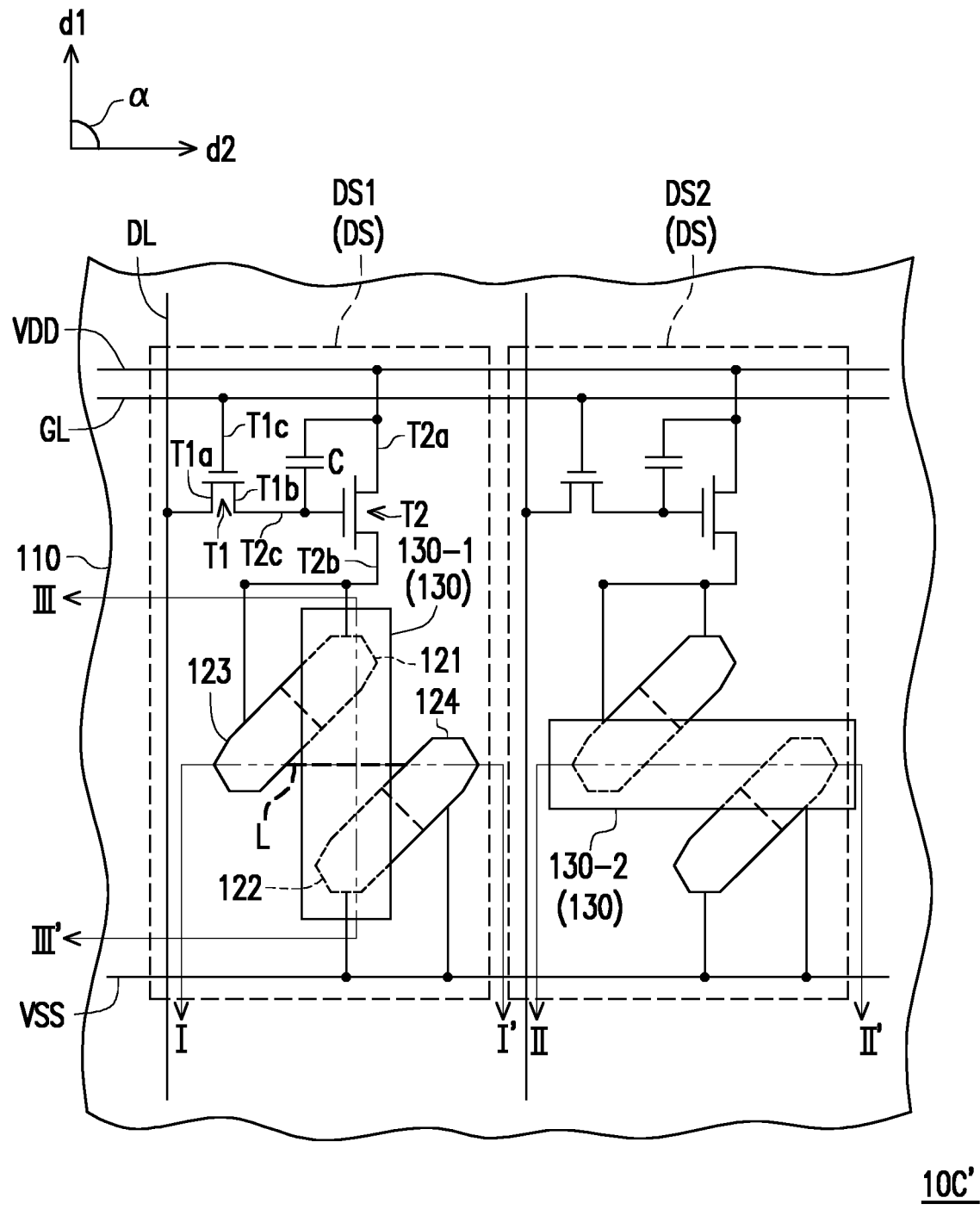
Figure 8A:
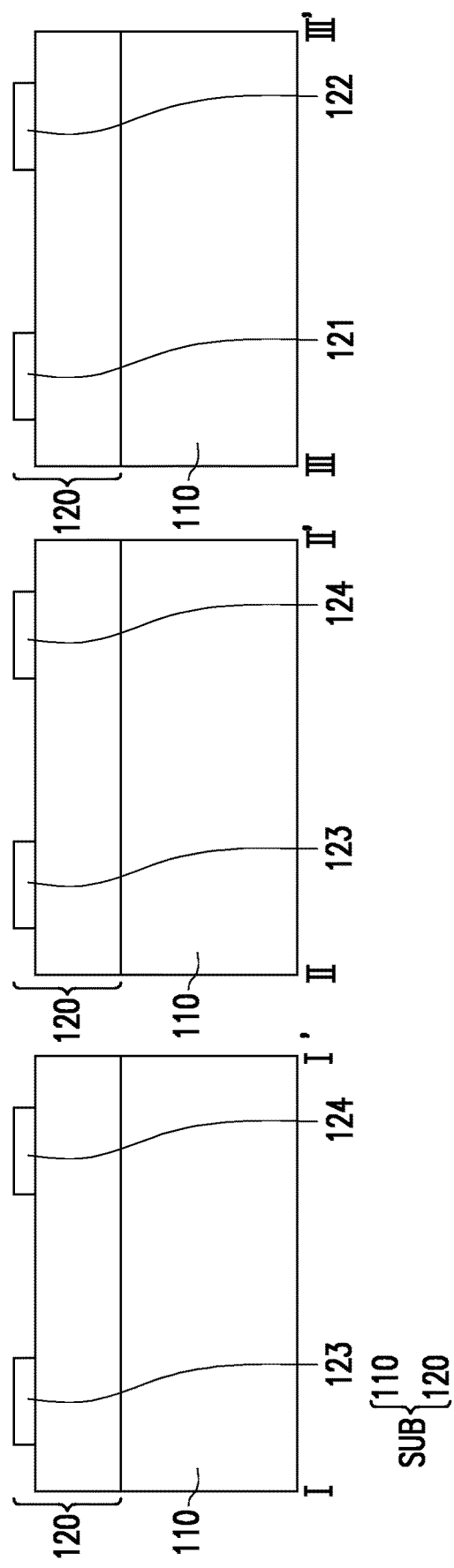
FIG. 8A to FIG. 8D are schematic cross-sectional views of the manufacturing processes of the display apparatus according to the fourth embodiment of the present invention.
Figure 8B:
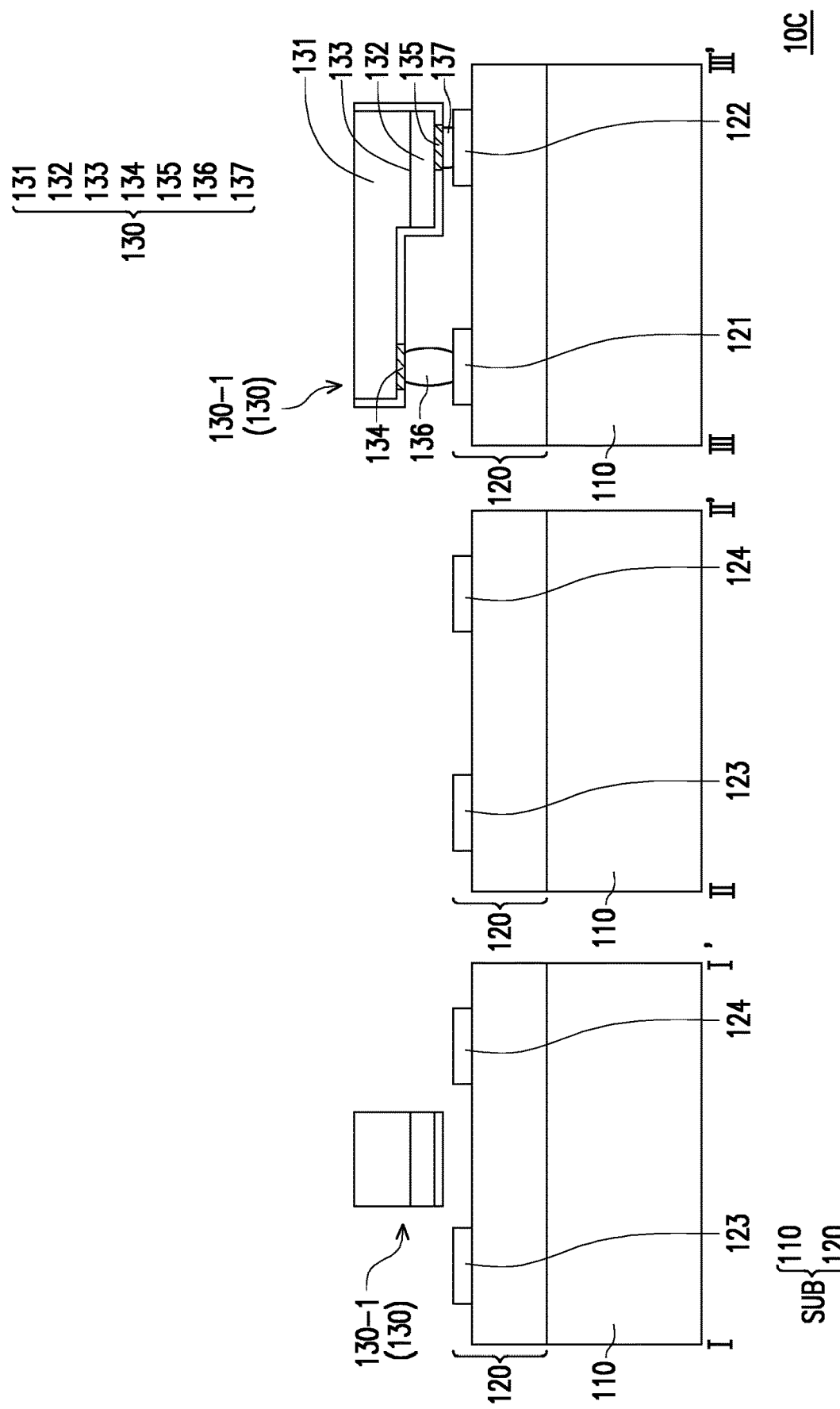
Figure 8C:
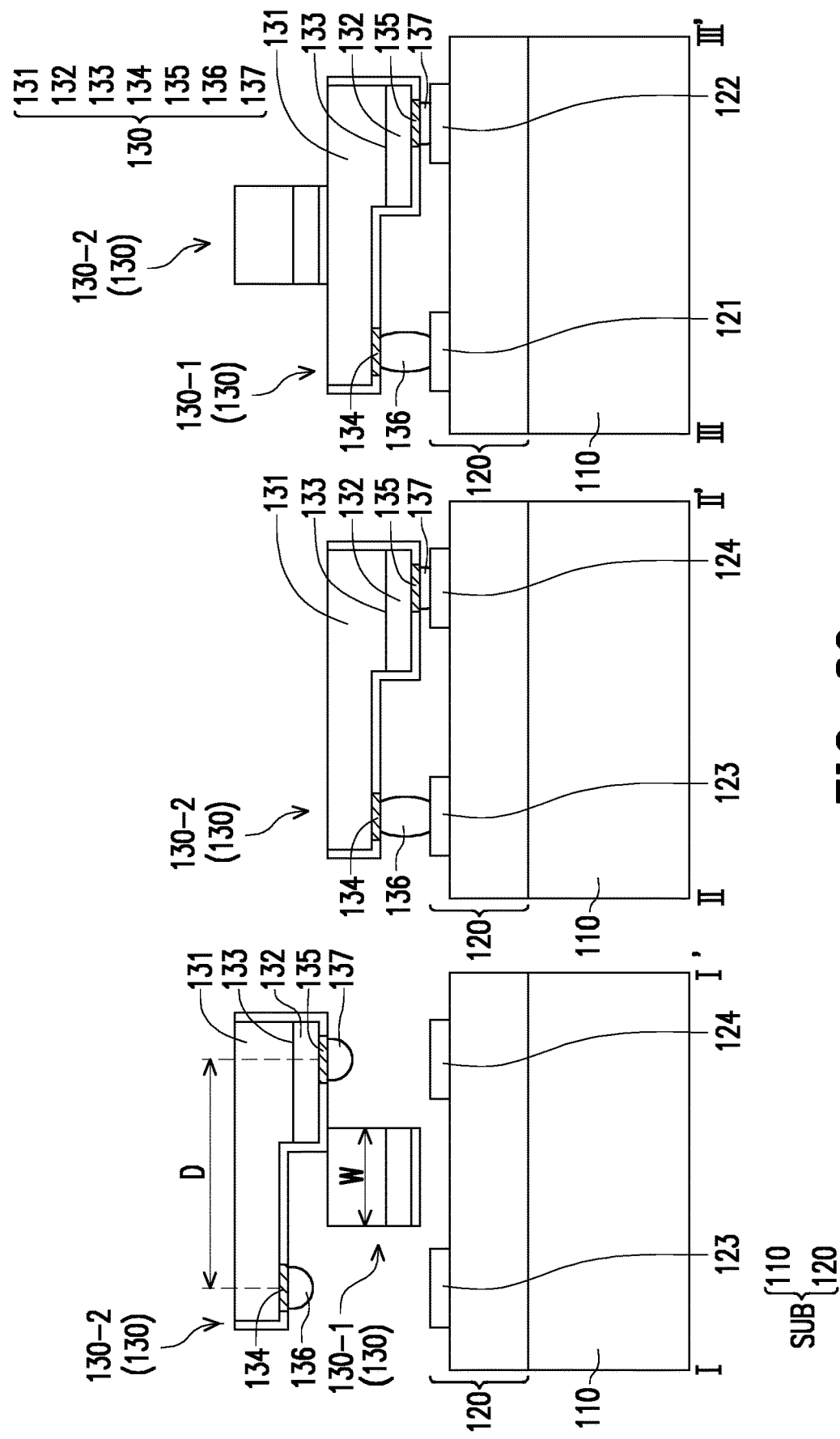
Figure 8D:
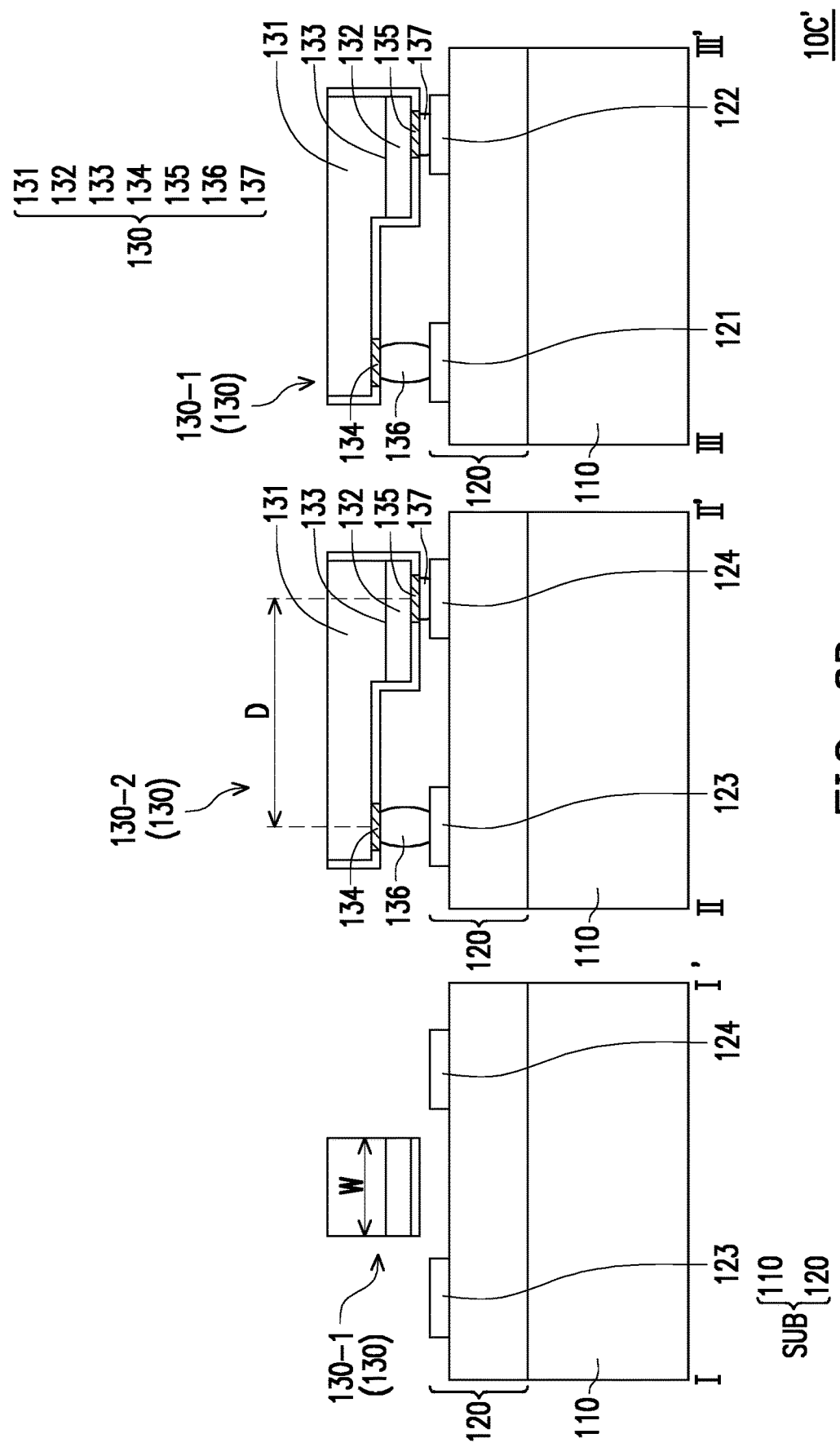

Referring to FIG. 5E and FIG. 6E, subsequently, a connecting element 153 is formed on another electrode (including but not limited to the first electrode 134) of the light emitting diode element 130-2, wherein another electrode (including but not limited to the first electrode 134) of the light emitting diode element 130-2 is electrically connected to another pad (including but not limited to the third pad 123) of the second pad set of the driving structure DS2 through the connecting element 153. Therefore, a repaired display apparatus 10B' is completed.

The display apparatus 10B' according to the present embodiment is similar to the above display apparatus 10', and the difference between the display apparatus 10B' and the display apparatus 10' is as follows: in the present embodiment, the first type semiconductor layer 131 of the light emitting diode element 130-1 is arranged between the first electrode 134 of the light emitting diode element 130-1 and the first pad 121, and the second electrode 135 of the light emitting diode element 130-1 is arranged between the second type semiconductor layer 132 of the light emitting diode element 130-1 and the second pad 122; and the first type semiconductor layer 131 of the light emitting diode element 130-2 is arranged between the first electrode 134 of the light emitting diode element 130-2 and the third pad 123, and the second electrode 135 of the light emitting diode element 130-2 is arranged between the second type semiconductor layer 132 of the light emitting diode element 130-2 and the fourth pad 124.

FIG. 7A to FIG. 7D are schematic top views of manufacturing processes of a display apparatus according to a fourth embodiment of the present invention. FIG. 8A to FIG. 8D are schematic cross-sectional views of the manufacturing processes of the display apparatus according to the fourth embodiment of the present invention. FIG. 8A to FIG. 8D are respectively corresponding to a section line I-I', a section line II-II' and a section line III-III' in FIG. 7A to FIG. 7D.

The display apparatuses 10C and 10C' according to the fourth embodiment and the manufacturing method thereof are similar to the display apparatuses 10 and 10' according to the first embodiment and the manufacturing method thereof, and the difference therebetween is as follows: in the present embodiment, the first pad 121 and the third pad 123 having the same first potential are connected, and/or the second pad 122 and the fourth pad 124 having the same second potential are connected. In other words, in the present embodiment, the first pad 121 and the third pad 123 can be two portions of the same first conductive pattern, and/or the second pad 122 and the fourth pad 124 can be two portions of the same second conductive pattern.

The manufacturing method of the display apparatuses 10C and 10C' according to the fourth embodiment is similar to the manufacturing method of the display apparatuses 10 and 10' according to the first embodiment, those skilled in the art should be able to implement the display apparatuses 10C and 10C' according to the above descriptions, FIG. 7A to FIG. 7D and FIG. 8A to FIG. 8D, and the details are not repeated herein.

Although the invention is described with reference to the above embodiments, the embodiments are not intended to limit the invention. A person of ordinary skill in the art may make variations and modifications without departing from the spirit and scope of the invention. Therefore, the protection scope of the invention should be subject to the appended claims.

What is claimed is:

1. A manufacturing method of a display apparatus, comprising:
    providing a driving substrate with a plurality of driving structures, wherein each of the driving structures comprises a first pad, a second pad, a third pad and a fourth pad, the first pad and the second pad are arranged in a first direction, the third pad and the fourth pad are arranged in a second direction, and the first direction intersects with the second direction; and
    transferring a plurality of first light emitting diode elements to the driving substrate, wherein the first light emitting diode elements are electrically connected to a plurality of first pads and a plurality of second pads of a plurality of first driving structures of the driving structures;
    wherein the driving structures further comprise a second driving structure, and the manufacturing method of the display apparatus further comprises:
    after the first light emitting diode elements are transferred to the driving substrate, enabling an extraction element to extract a plurality of second light emitting diode elements;
    enabling one of the plurality of second light emitting diode elements extracted by the extraction element to be transferred from the extraction element to the second driving structure, wherein when the one of the plurality of second light emitting diode elements is transferred from the extraction element to the second driving structure, another of the plurality of second light emitting diode elements touches a first light emitting diode element of the plurality of first light emitting diode elements, and the another of the plurality of second light emitting diode elements is blocked by the first light emitting diode element of the plurality of first light emitting diode elements;

enabling the one of the plurality of second light emitting diode elements to be electrically connected to the third pad and the fourth pad of the second driving structure.

2. The manufacturing method of the display apparatus according to claim 1, wherein the first pad and the third pad have a same first potential, and the second pad and the fourth pad have a same second potential.

3. The manufacturing method of the display apparatus according to claim 1, wherein the first pad, the second pad, the third pad and the fourth pad are structurally separated.

4. The manufacturing method of the display apparatus according to claim 1, wherein the first pad and the third pad are structurally connected.

5. The manufacturing method of the display apparatus according to claim 1, wherein the second pad and the fourth pad are structurally connected.

6. The manufacturing method of the display apparatus according to claim 1, wherein the first pad of the first driving structure and the second pad of the first driving structure are arranged in the first direction, the third pad of the second driving structure and the fourth pad of the second driving structure are arranged in the second direction.

7. The manufacturing method of the display apparatus according to claim 1, wherein the first light emitting diode element comprises:
a first type semiconductor layer;
a second type semiconductor layer;
an active layer arranged between the first type semiconductor layer and the second type semiconductor layer;
a first electrode electrically connected to the first type semiconductor layer; and
a second electrode electrically connected to the second type semiconductor layer, wherein the first electrode is arranged between the first type semiconductor layer and the first pad, and the second electrode is arranged between the second type semiconductor layer and the second pad.

8. The manufacturing method of the display apparatus according to claim 1, wherein the first light emitting diode element comprises:
a first type semiconductor layer;
a second type semiconductor layer;
an active layer arranged between the first type semiconductor layer and the second type semiconductor layer;
a first electrode electrically connected to the first type semiconductor layer; and
a second electrode electrically connected to the second type semiconductor layer, wherein the first type semiconductor layer is arranged between the first electrode and the first pad, and the second type semiconductor layer is arranged between the second electrode and the second pad.

9. The manufacturing method of the display apparatus according to claim 1, wherein the first light emitting diode element comprises:
a first type semiconductor layer;
a second type semiconductor layer;
an active layer arranged between the first type semiconductor layer and the second type semiconductor layer;
a first electrode electrically connected to the first type semiconductor layer; and
a second electrode electrically connected to the second type semiconductor layer, wherein the first type semiconductor layer is arranged between the first electrode and the first pad, and the second electrode is arranged between the second type semiconductor layer and the second pad.

* * * * *